US012757399B2

(12) United States Patent
Naito

(10) Patent No.: US 12,757,399 B2

(45) Date of Patent: Oct. 6, 2026

(54) MEMORY DEVICE

(71) Applicant: Kioxia Corporation, Tokyo (JP)

(72) Inventor: Hiroaki Naito, Kuwana (JP)

(73) Assignee: Kioxia Corporation, Tokyo (JP)

( * ) Notice: Subject to any disclaimer, the term of this patent is extended or adjusted under 35 U.S.C. 154(b) by 523 days.

(21) Appl. No.: 18/332,813

(22) Filed: Jun. 12, 2023

(65) Prior Publication Data

US 2024/0074196 A1 Feb. 29, 2024

(30) Foreign Application Priority Data

Aug. 31, 2022 (JP) ................................ 2022-138465

(51) Int. Cl.
*H10B 43/27* (2023.01)

(52) U.S. Cl.
CPC ................................... *H10B 43/27* (2023.02)

(58) Field of Classification Search
CPC ...................................................... H10B 43/27
See application file for complete search history.

(56) References Cited

U.S. PATENT DOCUMENTS

2018/0047748 A1 2/2018 Choi et al.
2020/0295040 A1* 9/2020 Tobioka ............ H01L 21/31144
2021/0020657 A1* 1/2021 Song ...................... H10B 41/27
2022/0093176 A1 3/2022 Nojima et al.

FOREIGN PATENT DOCUMENTS

JP 2022-51180 A 3/2022

* cited by examiner

*Primary Examiner* — Chad M Dicke
*Assistant Examiner* — Valerie N Newton
(74) *Attorney, Agent, or Firm* — Oblon, McClelland, Maier & Neustadt, L.L.P.

(57) ABSTRACT

A memory pillar penetrates first conductors that are aligned in a first direction separately from each other. A first member penetrates the first conductors in the first direction and has a first portion and second portions. The first portion extends in a second direction intersecting with the first direction. The second portions are aligned spaced apart in the second direction on an upper surface of the first portion. A length of each second portion in a third direction intersecting with the first and second directions is shorter than a length of the first portion in the third direction. The first member further includes a bridge that is positioned on the upper surface of the first portion and between two neighboring ones of the second portions and extends on the upper surface of the first portion across both ends of the first portion.

20 Claims, 38 Drawing Sheets

MEMORY DEVICE

CROSS-REFERENCE TO RELATED APPLICATION

This application is based upon and claims the benefit of priority from Japanese Patent Application No. 2022-138465, filed Aug. 31, 2022, the entire contents of which are incorporated herein by reference.

FIELD

Embodiments described herein relate generally to a memory device.

BACKGROUND

A memory device in which memory cells are arranged three-dimensionally is known.

DETAILED DESCRIPTION

In general, according to one embodiment, a memory device includes a plurality of first conductors aligned in a first direction separately from each other, a memory pillar that penetrates the plurality of first conductors in the first direction and includes a semiconductor and a film that surrounds the semiconductor, and a first member. The first member penetrates the plurality of first conductors in the first direction and has a first portion and a plurality of second portions. The first portion extends in a second direction intersecting with the first direction. The plurality of second portions are aligned spaced apart in the second direction on an upper surface of the first portion. A length of each of the plurality of second portions in a third direction intersecting with the first direction and the second direction is shorter than a length of the first portion in the third direction. The first member further includes a bridge that is positioned on the upper surface of the first portion and between two neighboring ones of the plurality of second portions and extends on the upper surface of the first portion across both ends of the first portion.

Embodiments will now be described with reference to the figures. The figures are schematic, and the relationship between the thickness and the area of a plane of a layer and the ratio of thicknesses of layers may differ from those in actuality. The figures may include components which differ in relations and/or ratios of dimensions in different figures.

The embodiments will be described using an x-y-z orthogonal coordinate system. A positive direction along the vertical axis of each figure may be referred to as "up", "above", "upper side", or the like, and a negative direction along the vertical axis of each figure may be referred to as "down", "below", "lower side", or the like. A positive direction along the horizontal axis of each figure may be referred to as "right", "right side", or the like, and a negative direction along the horizontal axis of each figure may be referred to as "left", "left side", or the like. The direction in which the x axis extends is referred to as an "x direction", the direction in which the y axis extends is referred to as a "y direction", and the direction in which the z axis extends is referred to as a "z direction".

1. First Embodiment

1.1. Configuration (Structure)

1.1.1 Memory Device

Figure 1:
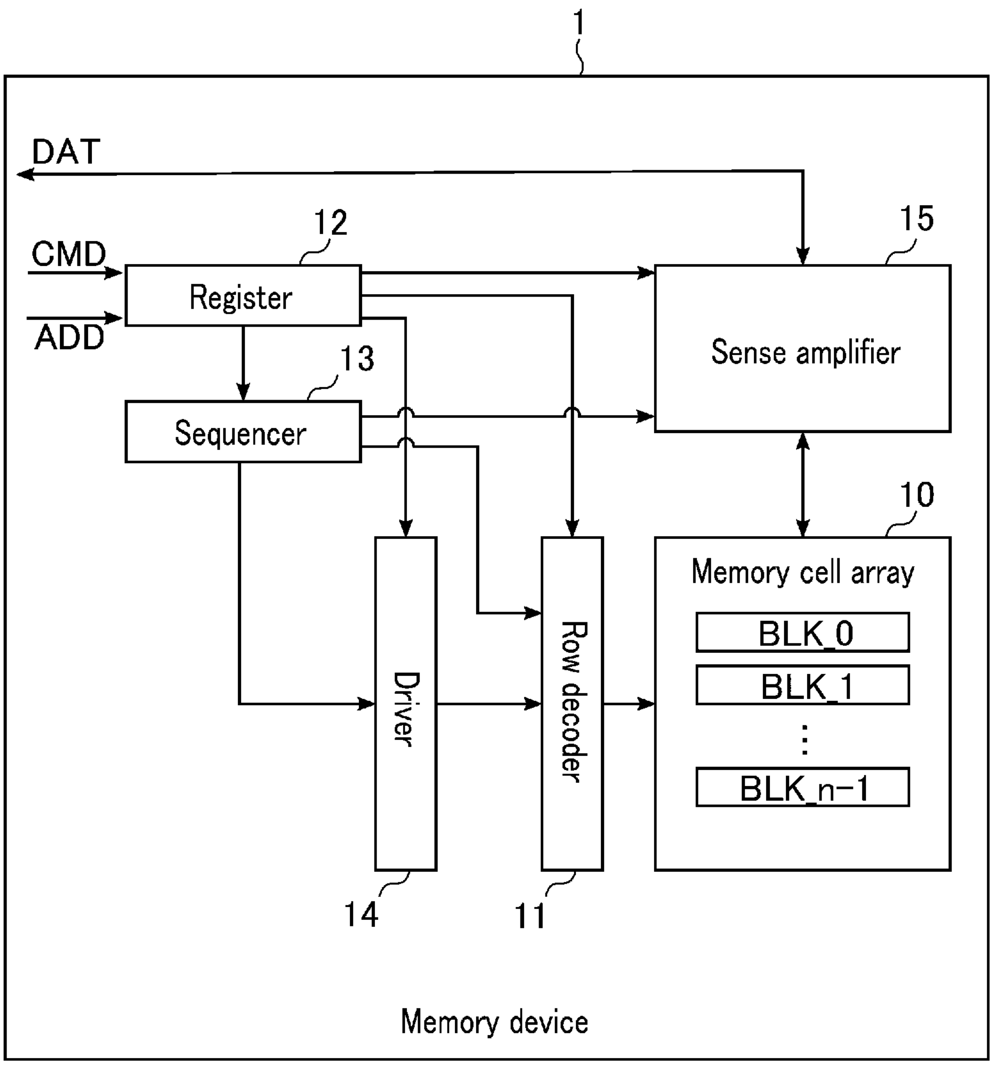
FIG. 1 shows an example of components of a memory device of a first embodiment and how they are coupled.

FIG. 1 shows an example of components of a memory device according to a first embodiment and how they are coupled. A memory device 1 stores data by using memory cells. The memory device 1 is controlled by, for example, an external memory controller. The memory device 1 operates based on, for example, a command CMD and address information ADD received from the memory controller. The memory device 1 receives data DAT to be written, and outputs data DAT stored in the memory device 1. The memory device 1 is configured, for example, as a single semiconductor chip.

As shown in FIG. 1, the memory device 1 includes components such as a memory cell array 10, a row decoder 11, a register 12, a sequencer 13, a driver 14, and a sense amplifier 15.

The memory cell array 10 is a set of groups of memory cell transistors. The memory cell array 10 includes a plurality of memory blocks (or, blocks) BLK (i.e., BLK_0, BLK_1, . . . ). Each of the blocks BLK includes a plurality of memory cell transistors MT (not shown). In the memory cell array 10, interconnects such as word lines WL (not shown) or bit lines BL (not shown), and interconnects that are coupled to the memory cell transistors MT are also located.

The row decoder 11 is a circuit that selects a block BLK. The row decoder 11 transfers voltages supplied from the driver 14, to a single block BLK selected based on a block address received from the register 12.

The register 12 is a circuit that holds a command CMD and address information ADD received by the memory device 1. The command CMD instructs the sequencer 13 to perform various operations including data read, data write, and data erase. The address information ADD designates a target of access in the memory cell array 10.

The sequencer 13 is a circuit that controls an operation of the entirety of the memory device 1. The sequencer 13 controls the row decoder 11, the driver 14, and the sense amplifier 15 based on the command CMD received from the register 12 to perform various operations including data read, data write, and data erase.

The driver 14 is a circuit that generates a plurality of voltages of different magnitudes, and applies the generated voltages to some components. The driver 14 supplies, from among the generated voltages, voltages selected based on control performed by the sequencer 13 and the address information ADD to the row decoder 11.

The sense amplifier 15 is a circuit that outputs a signal based on data stored in the memory cell array 10. The sense amplifier 15 senses a state of the memory cell transistor MT, generates read data based on the sensed state, or transfers write data to the memory cell transistor MT.

1.1.2. Circuit Configuration of Memory Cell Array

Figure 2:
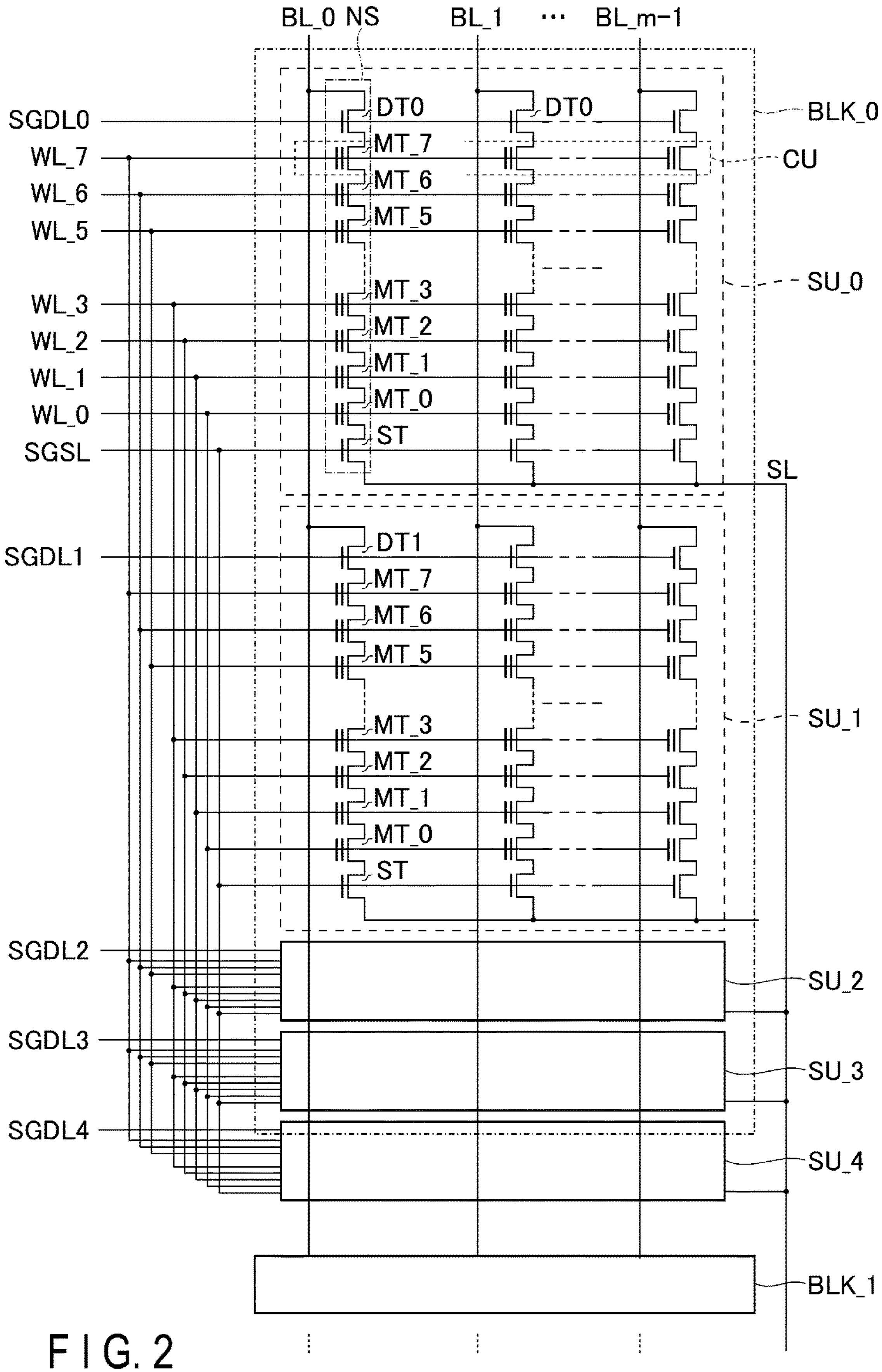
FIG. 2 shows components of a single block in the memory device of the first embodiment and how they are coupled.

FIG. 2 shows components of a single block BLK of the memory device according to the first embodiment, and coupling among the components. A plurality of blocks BLK, for example, all of the blocks BLK, includes the components and coupling that are shown in FIG. 2.

A single block BLK includes a plurality of string units SU. FIG. 2 shows an example of five string units SU_0 to SU_4.

As shown in FIG. 2, each of m bit lines BL_0 to BL_m−1 is coupled to a single NAND string NS from each of the string units SU_0 to SU_4 in each of the blocks BLK, where m is a positive integer.

Each of the NAND strings NS includes a single select gate transistor ST, a plurality of memory cell transistors MT, and a single select gate transistor DT (i.e., DT0, DT1, DT2, DT3, or DT4). FIG. 2 and the following description are based on an example where each NAND strings NS includes eight memory cell transistors MT_0 to MT_7. The memory cell transistor MT is an element that includes a control gate electrode and a charge storage film insulated from the periphery, and stores data based on a charge amount in the charge storage film in a non-volatile manner. The select gate transistor ST, the memory cell transistors MT, and the select gate transistor DT are coupled in series in this order between a source line SL and a single bit line BL.

A plurality of NAND strings NS respectively coupled to a plurality of different bit lines BL configure a single string unit SU. In each of the string units SU, the control gate electrodes of the memory cell transistors MT_0 to MT_7 are respectively coupled to word lines WL_0 to WL_7. A set of memory cell transistors MT that share a word line WL in a single string unit SU is referred to as a cell unit CU.

The select gate transistors DT0 to DT4 respectively belong to the string units SU_0 to SU_4. In FIG. 2, the select gate transistors DT2, DT3, and DT4 are not shown. A gate of the select gate transistor DT0 of each of the plurality of NAND strings NS of the string unit SU_0 is coupled to a select gate line SGDL0. Similarly, gates of the select gate transistor DT1, DT2, DT3, or DT4 of each of the plurality of NAND strings NS of each of the string units SU_1, SU_2, SU_3, and SU_4 are coupled to select gate lines SGDL1, SGDL2, SGDL3, or SGDL4, respectively.

A gate of the select gate transistor ST is coupled to a select gate line SGSL.

1.1.3 Planar Structure of Memory Cell Array

Figure 3:
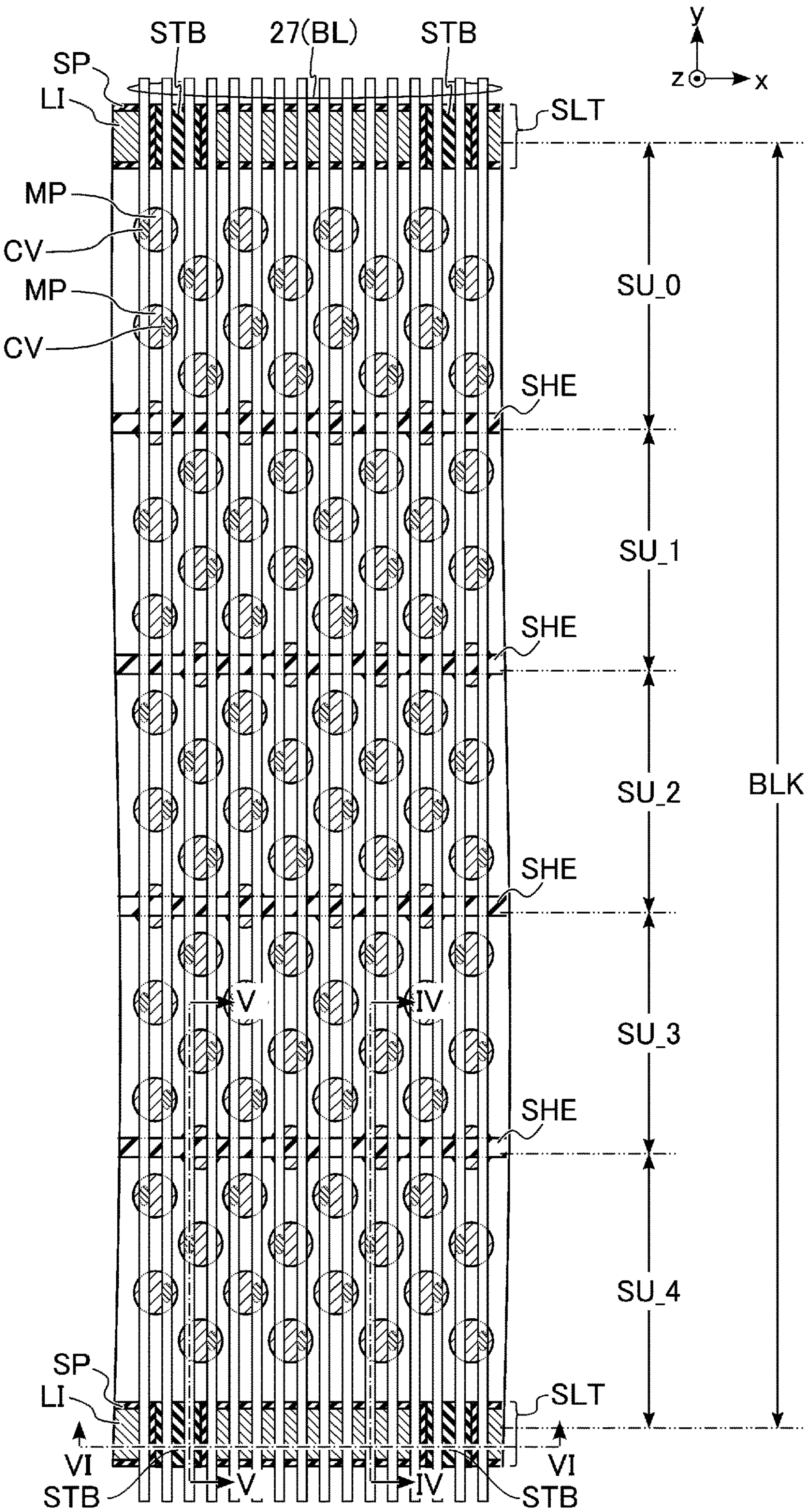
FIG. 3 shows an example of a planar structure of a part of a memory cell array in the memory device according to the first embodiment.

FIG. 3 shows an example of a planar structure of a part of a memory cell array of a memory device according to the first embodiment, along the xy-plane. FIG. 3 shows a region that includes a single block BLK (i.e., the string units SU_0 to SU_4). The structure shown in FIG. 3 is repeatedly arranged along the y direction.

As shown in FIG. 3, the memory cell array 10 includes a plurality of members (or structures) SLT, a plurality of memory pillars MP, a plurality of contact plugs CV, and a plurality of conductors 27.

Each member SLT extends in the x direction and is aligned in the y direction. Each member SLT is located at a boundary between neighboring blocks BLK. Each member SLT divides stack structures (which are described later) that are adjacent to each other with the member SLT interposed therebetween. Each member SLT includes a conductor LI, an insulator SP, and bridges STB. The conductor LI extends in the x direction and in the z direction. At a certain height (a position in the z direction), the conductor LI has portions aligned in the x direction spaced apart (portions in the second portion SLTt, which is described later).

The insulator SP occupies an area including the edge of the member SLT and covers the conductor LI. The insulator SP covers the side surfaces of the conductor LI, namely the surfaces extending in the x direction. The insulator SP contains, for example, silicon oxide.

A plurality of bridges STB are aligned in the x direction spaced apart. The plurality of bridges STB and the plurality portions of the conductor LI that are aligned spaced apart in the x direction are aligned to alternate with each other one at a time in the x direction. In other words, each bridge STB is positioned between two neighboring ones of portions of the conductor LI aligned spaced apart in the x direction. Each bridge STB extends from one edge toward the other edge of the member SLT in the y direction. Each bridge STB is locally located in the area that includes the upper end of the member SLT in the z direction, as described later. In the area between the bridges STB, the portion of the conductor LI is positioned. The bridge STB includes an insulator. The structure of the bridge STB will be described in detail later.

The memory pillar MP is a structure in which memory transistors MT are formed. The memory pillar MP includes a semiconductor and also includes one or more of conductors and insulators. Each memory pillar MP functions as a single NAND string NS. A plurality of memory pillars MP are distributed in a staggered arrangement in the region between two members SLT. In other words, the plurality of memory pillars MP are arranged in a plurality of columns extending in the y direction, and the columns of the memory pillars MP are arranged in a zig-zag manner along the x direction. The details of the arrangement are as follows. Each column consists of two sub-columns located at different positions in the x direction. Hereinafter, a position in the x direction may be referred to as an "x-direction position", and a position in the y direction may be referred to as a "y-direction position". Each y-direction position of the memory pillar MP of one sub-column corresponds to a y-direction position between two neighboring memory pillars MP in the other sub-column. Each column includes 24 memory pillars MP, for example.

The plurality of members SHE extend in the x direction and are aligned in the y direction. The plurality of members SHE are arranged between two neighboring members SLT. FIG. 3 shows an example of four members SHE. Each member SHE divides select gate lines SGDL (described later) that are adjacent to each other with the member SHE interposed therebetween. Each area divided by the two neighboring one of members SLT and SHE is an area in which a single string unit SU is formed. The member SHE includes an insulator. The member SHE overlaps, for example, the 5th, 10th, 15th, and 20th rows of memory pillars MP from the top in FIG. 3.

Each conductor 27 functions as a single bit line BL. The conductors 27 extend in the y direction and are aligned in the x direction. Each conductor 27 is arranged to overlap at least one memory pillar MP in each string unit SU. FIG. 3 shows an example in which two conductors 27 are arranged in such a manner that they overlap with the same memory pillar MP. Each memory pillar MP is electrically coupled via a contact plug CV to a single conductor 27 of a plurality of conductors 27 that overlap with this memory pillar MP.

1.1.4. Structure of Memory Cell Area

Figure 4:
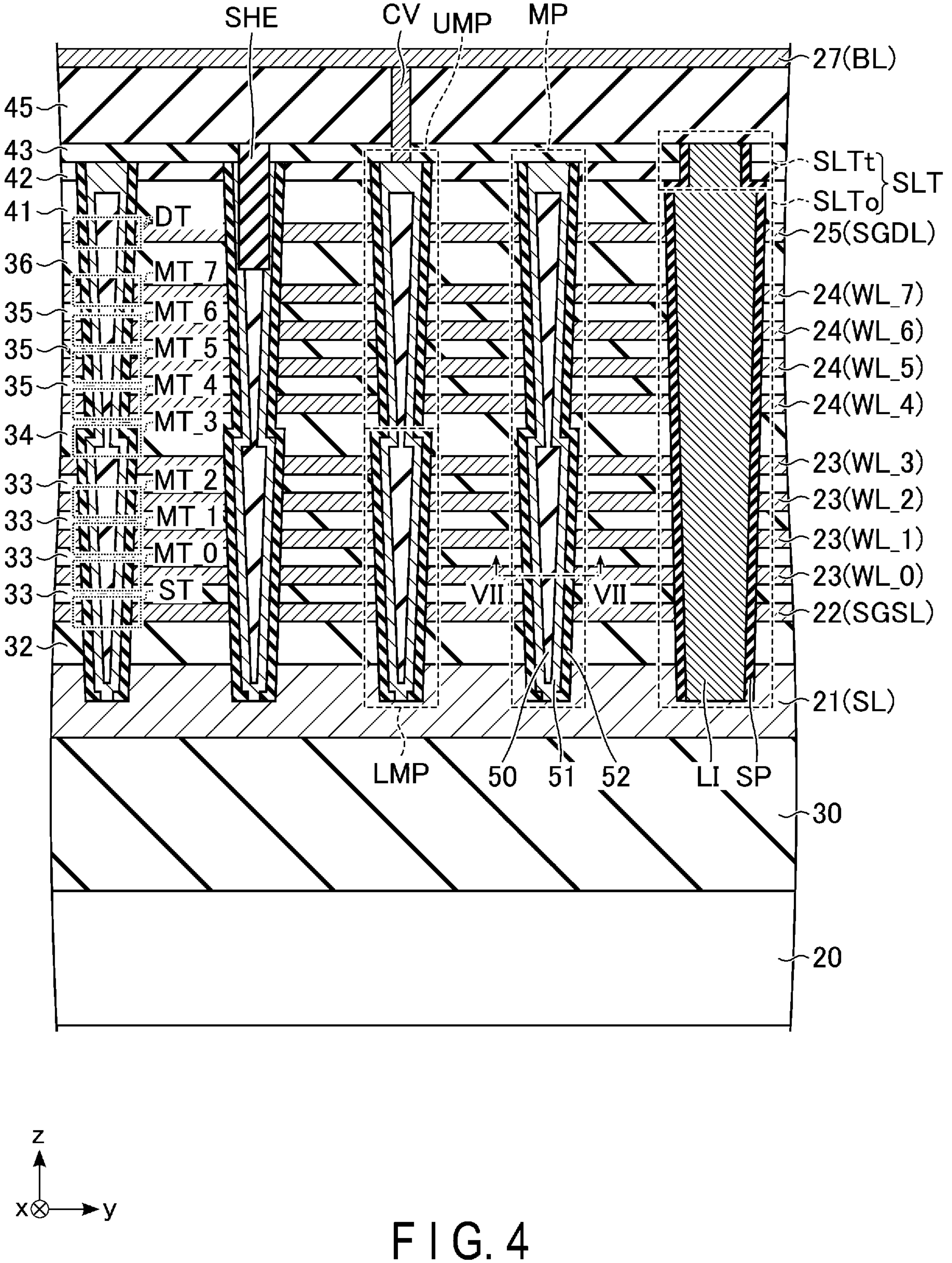
FIGS. 4 to 6 show examples of cross-sectional structures of a part of the memory cell array in the memory device according to the first embodiment.

FIG. 4 shows a cross-sectional structure of a part of a memory cell array of the memory device according to the first embodiment, along the yz-plane. Specifically, FIG. 4 shows a cross-section along line IV-IV shown in FIG. 3.

As shown in FIG. 4, the memory cell array 10 further includes a substrate 20, conductors 21 and 22, eight conductors 23 and 24, a conductor 25, and a conductor 27, and insulators 30, 32, 33, 34, 35, 36, 41, 42, 43, and 45.

The substrate 20 is a p-type semiconductor substrate, for example.

The insulator 30 is positioned on the upper surface of the substrate. The insulator 30 contains, for example, silicon oxide. In the substrate 20 and the insulator 30, a circuit (not shown) can be formed. Such a circuit is, for example, a row decoder 11, a driver 14, and/or a sense amplifier 15, and includes transistors (not shown).

The conductor 21 is located on the upper surface of the insulator 30. The conductor 21 has a plate-like shape and extends in the xy plane. The conductor 21 functions as at least a part of a source line SL. The conductor 21 contains phosphate-doped silicon, for example.

The insulator 32 is located on the upper surface of the conductor 21. The insulator 32 contains, for example, silicon oxide.

The conductor 22 is located on the upper surface of the insulator 32. The conductor 22 has a plate-like shape and extends in the xy plane. The conductor 22 functions as at least a part of a select gate line SGSL. The conductor 22 contains, for example, tungsten. Other materials, such as aluminum oxide, may be provided on the surface of the conductor 22.

The plurality of insulators 33 and the plurality of conductors 23 are arranged on the upper surface of the conductor 22 in the z direction to alternate with each other one at a time. The conductors 23 are therefore aligned separately or spaced apart in the z direction. The insulators 33 and conductors 23 have a plate-like shape and extend in the xy plane. The conductors 23 function as at least a part of word lines WL_0 through WL_3 in this order from the substrate 20 side. The conductors 23 contain, for example, tungsten. Other materials, such as aluminum oxide, may be provided on the surface of the conductor 23. The insulators 33 contain, for example, silicon oxide.

The insulator 34 is positioned on the upper surface of the uppermost conductor 23. The insulator 34 has a plate-like shape and extends in the xy plane. The insulator 34 contains, for example, silicon oxide.

The plurality of conductors 24 and the plurality of insulators 35 are arranged on the upper surface of the insulator 34 in the z direction to alternate with each other one at a time. The conductors 24 are therefore aligned separately or spaced apart in the z direction. The conductors 24 and the insulators 35 have a plate-like shape and extend in the xy plane. The conductors 24 function as at least a part of word lines WL_4 to WL_7 in this order from the substrate 20 side. The conductor 24 contains, for example, tungsten. Other materials, such as aluminum oxide, may be provided on the surface of the conductor 24. The insulators 35 contain, for example, silicon oxide.

The insulator 36 is positioned on the upper surface of the uppermost conductor 24. The insulator 36 has a plate-like shape and extends in the xy plane. The insulator 36 contains, for example, silicon oxide.

The conductor 25 is positioned on the upper surface of the insulator 36. The conductor 25 has a plate-like shape and extends in the xy plane. The conductor 25 functions as at least a part of one of a select gate lines SGDL0 to SGDL4. The conductor 25 contains, for example, tungsten. Other materials, such as aluminum oxide, may be provided on the surface of the conductor 25.

The insulator 41 is located on the upper surface of the conductor 25. The insulator 41 has a plate-like shape and extends in the xy plane. The insulator 41 contains, for example, silicon oxide.

The insulator 42 is positioned on the upper surface of the insulator 41. The insulator 42 has a plate-like shape and extends in the xy plane. The insulator 42 contains, for example, silicon oxide.

The insulator 43 is positioned on the upper surface of the insulator 42. The insulator 43 has a plate-like shape and extend in the xy plane. The insulator 43 contains, for example, silicon oxide.

The insulator 45 is positioned on the upper surface of the insulator 43. The insulator 45 has a plate-like shape and extends in the xy plane. The insulator 45 contains, for example, silicon oxide.

The conductor 27 is positioned on the upper surface of the insulator 45. The conductor 27 has a linear shape extending in the y direction. The conductor 27 functions as at least a part of a single bit line BL. The conductor 27 is provided on another yz plane, which differs from the yz plane shown in FIG. 4. A plurality of conductors 27 are therefore aligned spaced apart in the x direction. The conductor 27 contains copper (Cu), for example.

The memory pillars MP extend in the z direction and have a columnar shape. The memory pillars MP are positioned within a stack structure consisting of the conductors 21 to 25 and the insulators 32-36, 41, and 42, and penetrate through the set of the conductors 22 to 25 and the insulators 32-36, 41, and 42. Each memory pillar MP has a lower surface positioned in the conductor 21. The upper surface of the memory pillars MP is flush with, for example, the upper surface of the insulator 42.

Each memory pillar MP includes an upper memory pillar UMP and a lower memory pillar LMP. The upper surface of the lower memory pillar LMP is in contact with the lower surface of the upper memory pillar UMP. The upper memory pillar UMP penetrates the set of the conductors 24 and 25 and the insulators 35, 36, 41, and 42, and has a lower surface positioned in the insulator 34. The lower memory pillar LMP penetrates the set of the conductors 22 and 23 and the insulators 32 and 33. The lower memory pillar LMP has an upper surface positioned in the insulator 34 and a lower surface positioned in the conductor 21.

Each of the lower memory pillar LMP and the upper memory pillar UMP has an xy cross-sectional area that decreases from the upper surface toward the lower surface. The xy cross-sectional area is an area of the plane along the xy plane. The xy cross-sectional area of the upper surface of the lower memory pillar LMP is greater than the xy cross-sectional area of the lower surface of the upper memory pillar UMP. For this reason, the side surface of the lower memory pillar LMP and an extension of the side surface of the upper memory pillar UMP deviate from each other and do not align. Such a deviation between the side surface of the lower memory pillar LMP and an extension of the side surface of the upper memory pillar UMP occurs not only in the yz cross section shown in FIG. 4 but also in other cross sections that include z-axis.

Each memory pillar MP includes a core 50, a semiconductor 51, and a layer stack 52, for example. The core 50 extends in the z direction and has a columnar shape. The upper surface of the core 50 is positioned in a layer above the layer of the conductor 25, and the lower surface of the core 50 is positioned in a layer lower than the layer of the conductor 22. The outline of the core 50 is in line with, for example, the outline of the memory pillar MP. In other words, the core 50 includes a portion included in the upper memory pillar UMP and a portion included in the lower memory pillar LMP. The lower surface of the portion of the core 50 included in the upper memory pillar UMP is connected to the upper surface of the portion included in the lower memory pillar LMP. Each of the portion of the core 50 included in the upper memory pillar UMP and the portion included in the lower memory pillar LMP has an xy cross-section area that decreases from the upper surface toward the lower surface.

The semiconductor 51 covers the surface of the core 50. The semiconductor 51 contains silicon, for example. The layer stack 52 covers the side surface and the lower surface of the semiconductor 51. The layer stack 52 opens within the conductor 21. The opening is positioned in, for example, the lower surface of the memory pillar MP. The semiconductor 51 is partially positioned within the opening, and the semiconductor 51 and the conductor 21 are in contact with each other within the opening. The opening of the layer stack 52 may be positioned in the side surface of the memory pillar MP. In this case, the opening is positioned in the side surface of the memory pillar MP and within the conductor 21.

The portion where the memory pillar MP faces the conductor 22 functions as a select gate transistor ST. The portion where the memory pillar MP faces a single conductor 23 or 24 functions as a single memory cell transistor MT. The portion where the memory pillar MP faces the conductor 25 functions as a single select gate transistor DT.

The member SHE is positioned partially within a single memory pillar MP of the plurality of memory pillars MP shown in FIG. 4. The member SHE divides the conductor 25. The lower surface of the member SHE is positioned within the layer of the insulator 36. The member SHE contains an insulator, for example silicon oxide.

The contact plug CV is in contact with a single memory pillar MP on its lower surface, and in contact with a single conductor 27 on its upper surface.

Figure 5:
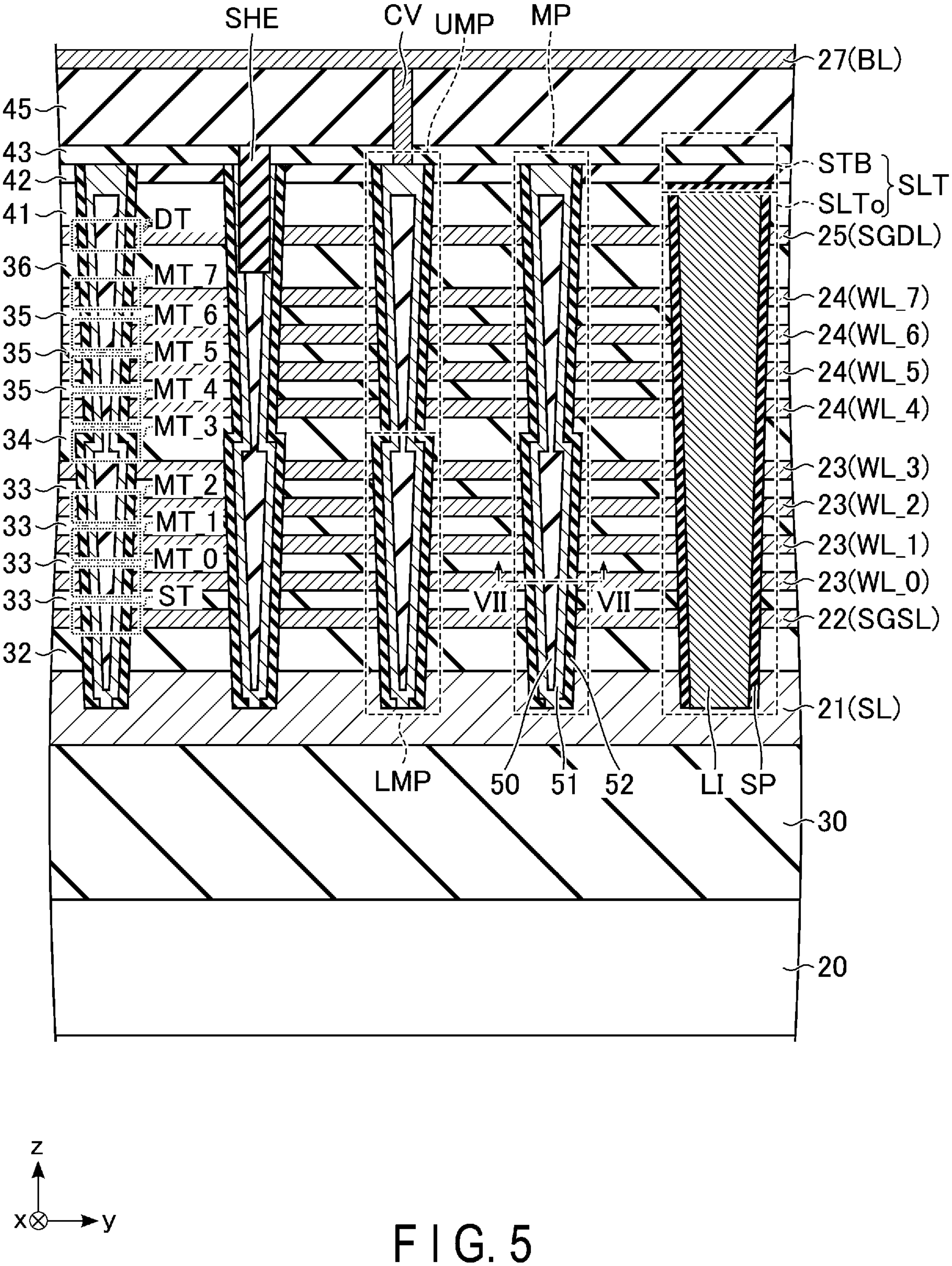
Figure 6:
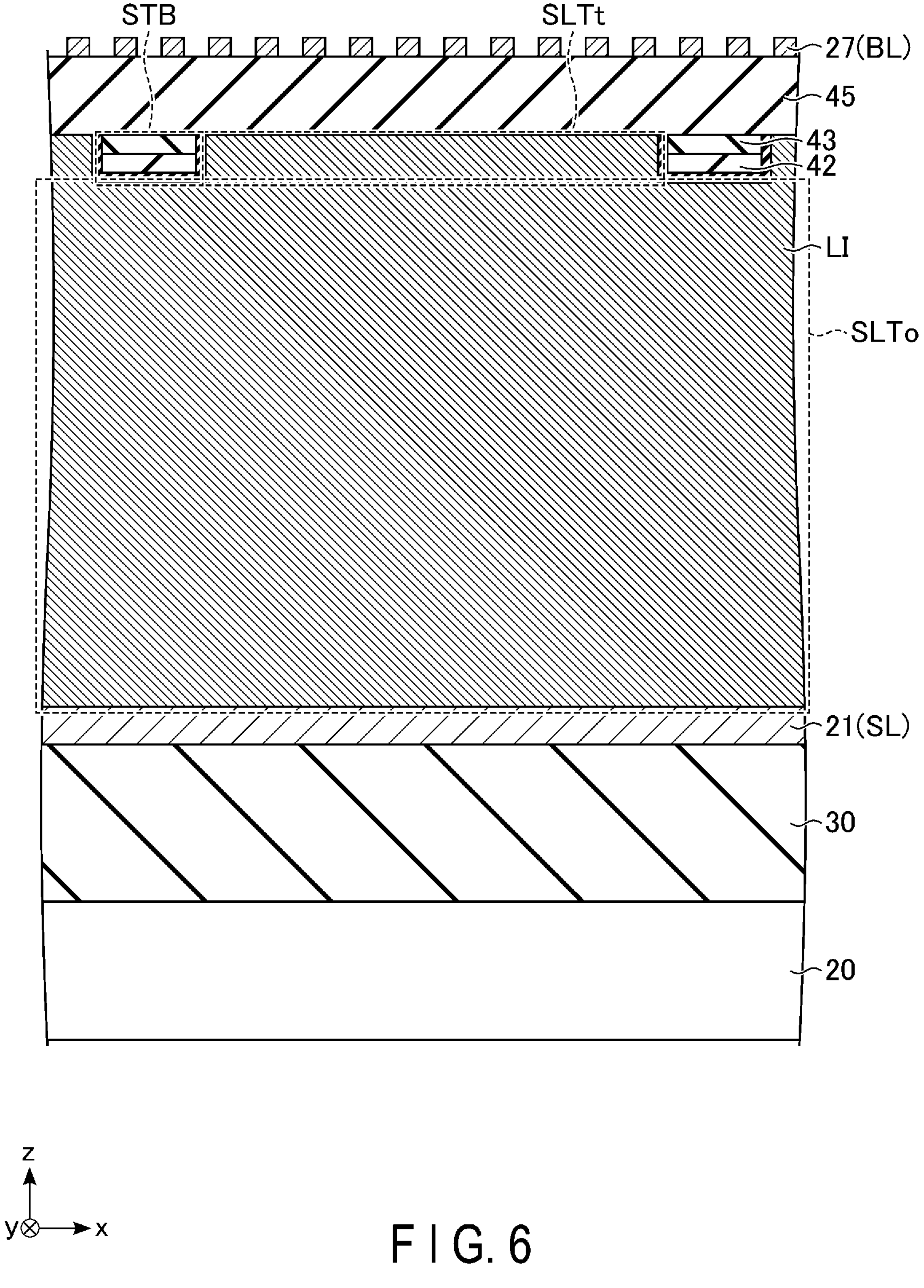

The member SLT is described hereinafter, with reference to FIGS. 5 and 6 in addition to FIG. 4. FIG. 5 shows a cross-sectional structure of a part of a memory cell array of the memory device according to the first embodiment, along the yz-plane. Specifically, FIG. 5 shows a cross-section along line V-V shown in FIG. 3. FIG. 6 shows a cross-sectional structure of a part of a memory cell array of the memory device according to the first embodiment, along the xz-plane. Specifically, FIG. 6 shows a cross-section along line VI-VI shown in FIG. 3.

As shown in FIG. 4, the member SLT extends in the z direction. The member SLT divides the conductors 22 to 25. The member SLT is positioned in the stack structure consisting of the conductors 21 to 25 and the insulators 32 to 36, 41, 42, and 43, and penetrates the set of the conductors 22 to 25 and the insulators 32 to 36, 41, 42, and 43. The upper surface of the member SLT is flush with, for example, the upper surface of the insulator 43.

The member SLT includes a first portion SLTo and a plurality of second portions SLTt. The upper surface of the first portion SLTo and the lower surface of the second portion SLTt are in contact with each other. The first portion SLTo and the second portion SLTt are continuous; in other words, they are a single object formed in the same process, not a set of separate elements formed in different processes and connected to each other.

The first portion SLTo penetrates the set of the conductors 22 to 25 and the insulators 32 to 36 and 41, and has a lower surface positioned in the conductor 21. The upper surface of the first portion SLTo is flush with, for example, the upper surface of the insulator 41. The first portion SLTo has, for example, an xy cross-sectional area that decreases from the upper surface toward the lower surface, and has, for example, a y dimension that decreases from the upper surface toward the lower surface. The y dimension is a dimension in the y direction (or, length).

Each second portion SLTt penetrates the set of insulators 42 and 43. The upper surface of the second portion SLTt is flush with, for example, the upper surface of the insulator 43. The lower surface of the second portion SLTt is flush with, for example, the upper surface of the insulator 41. The y dimension of the lower surface of the second portion SLTt is smaller than the y dimension of the upper surface of the first portion SLTo. For example, the side surface of the second portion SLTt (or, the surface along the xz surface) is positioned inside the side surface of the first portion SLTo (or, the surface along the xz surface) when viewed from the top (or, with respect to the shape of the surface along the xy surface). A part of the insulator 42 and a part of the insulator 43 are positioned above the portion where the second portion SLTt is not positioned on the upper surface of the first portion SLTo.

The insulator SP spans across the area including the side surface of the first portion SLTc and the area including the side surface of the second portion SLTt. The insulator SP has a portion positioned on the upper surface of the first portion SLTo. The insulator SP is continuous across the area including the side surface of the first portion SLTo, the area on the upper surface of the first portion SLTo, and the area including the side surfaces of the second portions SLTt.

The conductor LI is positioned in the area where the insulator SP is not positioned in the first portion SLTo and the area where the insulator SP is not positioned in the second portions SLTt. The conductor LI is positioned in the central area in the SLT in the y direction, and is in contact with the insulator SP in both side surfaces (or, the surfaces along the xy plane). The conductor LI fills the area where the insulator SP is not positioned in the first portion SLTo and the area where the insulator SP is not positioned in the second portion SLTt. Of the conductor LI, the lower surface of the portion within the first portion SLTo is in contact with the conductor 21. The conductor LI functions as a part of the source line SL.

The area shown in FIG. 5 is an area in which a bridge STB is provided. As shown in FIG. 5, in the area opposite to (or, below) the area in which the bridge STB is provided with respect to the z direction, the insulator SP covers the upper surface of the first portion SLTo, more specifically, the upper surface of the first portion SLTo of the conductor LI. In other words, the insulator SP covers the lower surface of the bridge STB. The portion that covers the lower surface of the bridge STB of the insulator SP is continuous to the portion that includes the side surface of the first portion SLTo in the insulator SP.

The bridge STB is a part of the set of the insulator 42 and the insulator 43. In other words, the set of the insulator 42 and the insulator 43 is positioned in a part between the second portions SLTt, and the bridge STB consists of the portion between the second portions SLTt.

As shown in FIG. 6, the first portion SLTo extends in the x direction and is continuous in the x direction. The plurality of second portions SLTt and the plurality of bridges STB are aligned in the x direction to alternate with each other one at a time. The x-direction aligned side surfaces of the bridges STB (or, the surfaces along the yz plane) are covered by a part of the insulator SP.

Each second portion SLTt and each bridge STB may have any dimension in the x direction. The plurality of second portions SLTt may have respective different x dimensions. The x dimension is a dimension (or, length) in the x direction. The plurality of bridges STB may have respective different x dimensions. Thus, the bridges STB may be periodically aligned spaced equally apart in the x direction or randomly aligned. However, as shown in the examples of FIGS. 6 and 3, the x dimension of the second portion SLTt is generally longer than the x dimension of the bridge STB. For this reason, a sum of the x dimensions of all second portions SLTt included in a single member SLT is larger than a sum of the x dimensions of all bridges STB included in the same member SLT.

Figure 7:
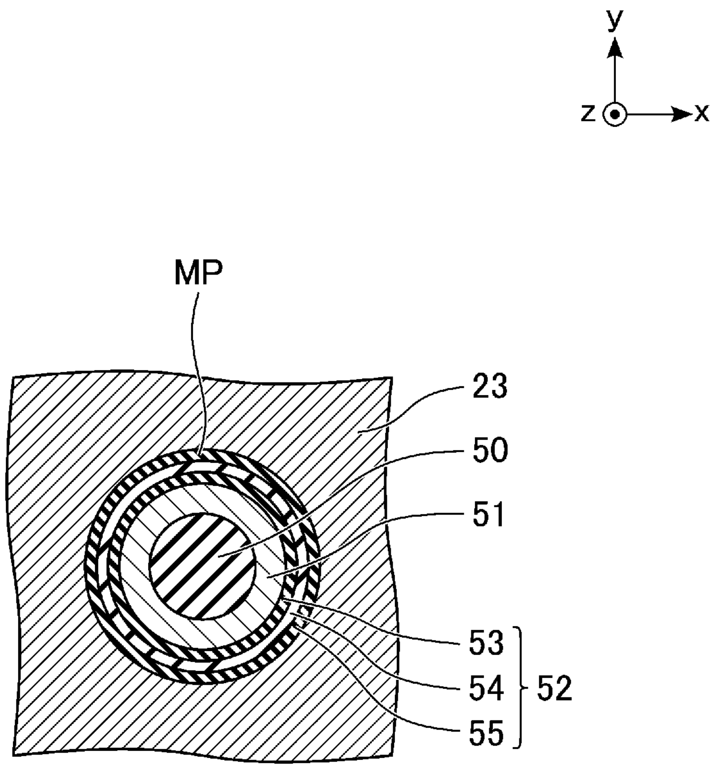
FIG. 7 shows a cross-sectional structure of a memory pillar of the memory device according to the first embodiment.

FIG. 7 shows a cross-sectional structure of a memory pillar of the memory device according to the first embodiment. Specifically, FIG. 7 shows a cross-section along line VII-VII shown in FIG. 4. As shown in FIG. 7, the layer stack 52 includes, for example, a tunnel insulator 53, a charge storage layer 54, and a block insulator 55.

The tunnel insulator 53 surrounds the side surface of the semiconductor 51. The charge storage layer 54 surrounds the side surface of the tunnel insulator 53. The block insulator 55 surrounds the side surface of the charge storage layer 54. The conductor 23 surrounds the side surface of the block insulator 55.

The semiconductor 51 functions as a channel (or, current path) for the memory cell transistors MT and the select gate transistors DT and ST. Each of the tunnel insulator 53 and the block insulator 55 contains, for example, silicon oxide. The charge storage layer 54 is capable of storing charge. The charge storage layer 54 contains silicon nitride, for example.

1.2 Manufacturing Method

FIGS. 8 to 31 show examples of cross-sectional structures of a part of the memory cell array in the memory device according to the first embodiment during a manufacturing process. FIGS. 8, 9, 10, 12, 14, 16, 18, 19, 20, 23, 26, 27, and 29 show the structures during the manufacturing process in order. FIGS. 8, 9, 10, 12, 14, 16, 18, 19, 20, 23, 26, 27, and 29 show cross-sections of the same area as the cross-sectional area shown in FIG. 4.

FIGS. 21, 24, 28, and 30 show the same steps as those shown in FIGS. 20, 23, 27, and 29, respectively. FIGS. 21, 24, 28, and 30 show cross-sections of the same area as the cross-sectional area shown in FIG. 5.

FIGS. 11, 13, 15, 17, 22, 25, and 31 show the same steps as those shown in FIGS. 10, 12, 14, 16, 20, 23, and 29, respectively. FIGS. 11, 13, 15, 17, 22, 25, and 31 show cross-sections of the same area as the cross-sectional area shown in FIG. 6.

Figure 8:
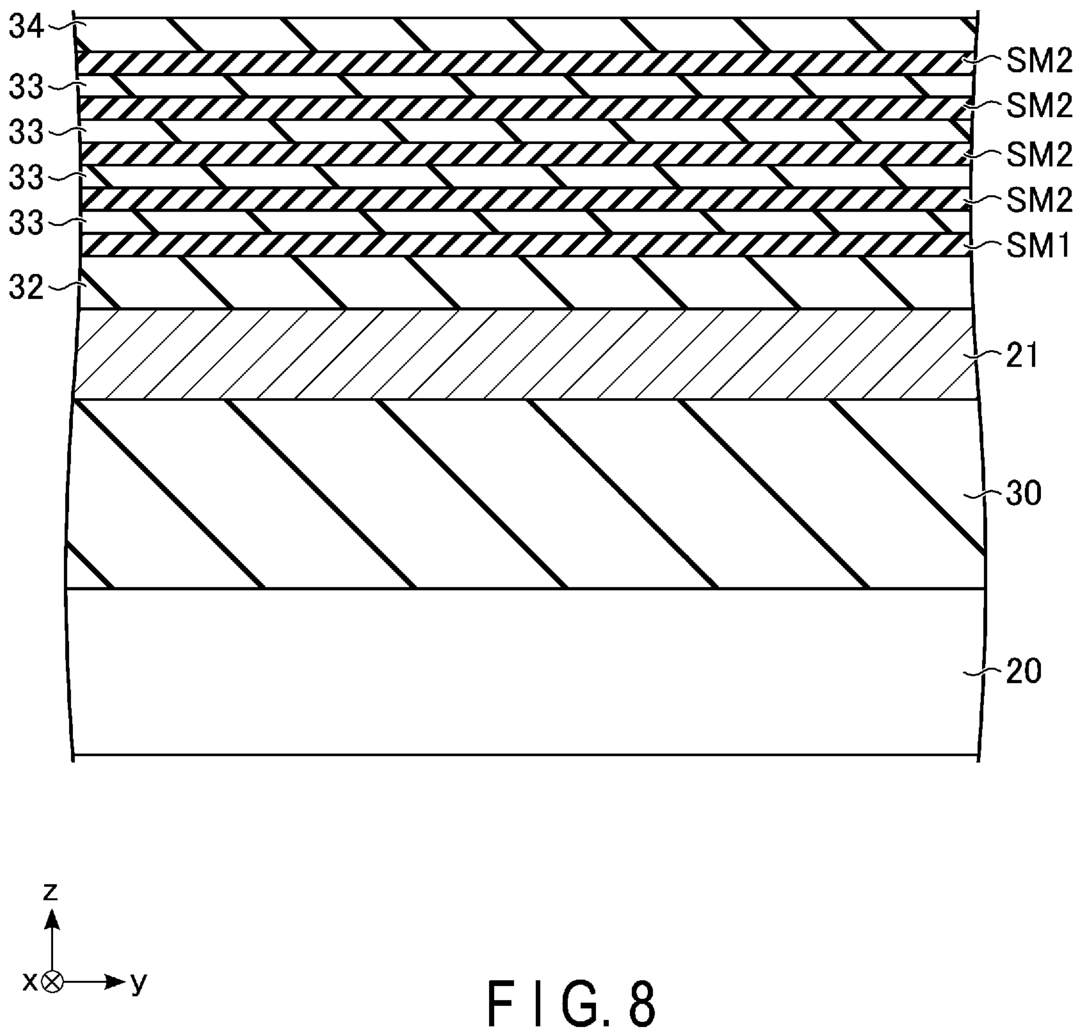
FIGS. 8 to 31 show examples of cross-sectional structures of a part of the memory cell array in the memory device according to the first embodiment during a manufacturing process.

As shown in FIG. 8, an insulator 30, a conductor 21, insulators 32, SM1, 33, and SM2, and an insulator 34 are formed on the upper surface of the substrate 20. In other words, an insulator 30, a conductor 21, and insulators 32 and SM1 are first deposited on the upper surface of the substrate 20 in this order. The insulator SM1 occupies the area in which the conductor 22 is slated to be formed. The insulator SM1 contains, for example, silicon nitride. Examples of the deposition method include chemical vapor deposition (CVD). When a circuit is formed on the substrate 20, the circuit is formed before the insulator 30 is formed.

On the upper surface of the insulator SM1, a single insulator 33 and a single insulator SM2 are alternately deposited for multiple layers. Each of the insulators SM2 occupies the area in which a single conductor 22 is slated to be formed. The insulator SM2 contains, for example, silicon nitride. Examples of the deposition method include CVD.

On the upper surface of the uppermost insulator SM2, the lower portion of the insulator 34 is deposited. Examples of the deposition method include CVD.

Figure 9:
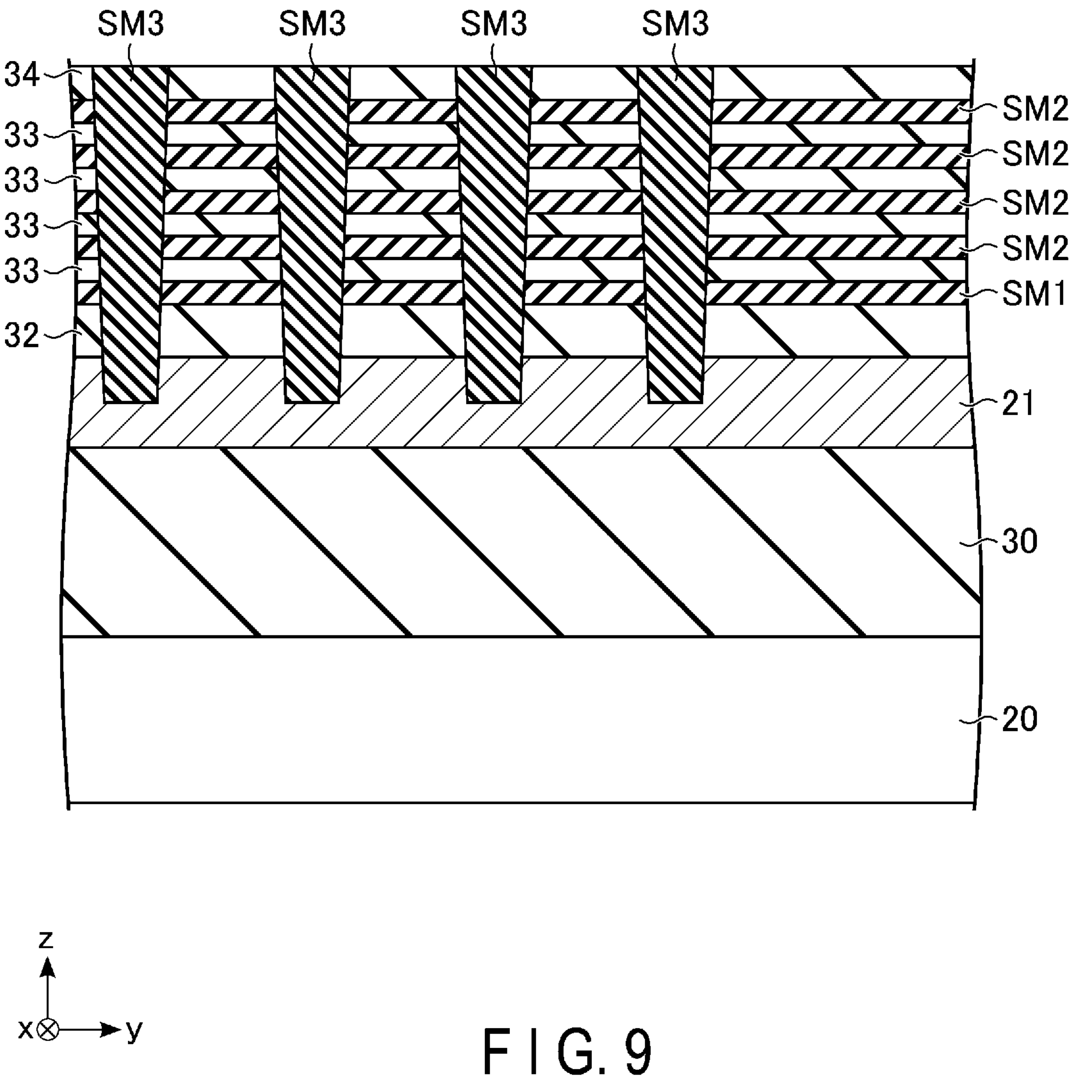

As shown in FIG. 9, insulators SM3 are formed. Specifically, for example, memory holes LMH (not shown) are first formed, by a photolithography process and anisotropic etching such as reactive ion etching (RIE), etc., in the areas in which the lower memory pillars LMP are slated to be formed. Each memory hole LMH penetrates the insulators 34, SM2, 33, SM1, and 32, and the lower surface of each memory hole LMH is located within the conductor 21. Next, the memory holes LMH are filled with a material of the insulator SM3. The insulator SM3 contains carbon or amorphous silicon, for example.

Figure 10:
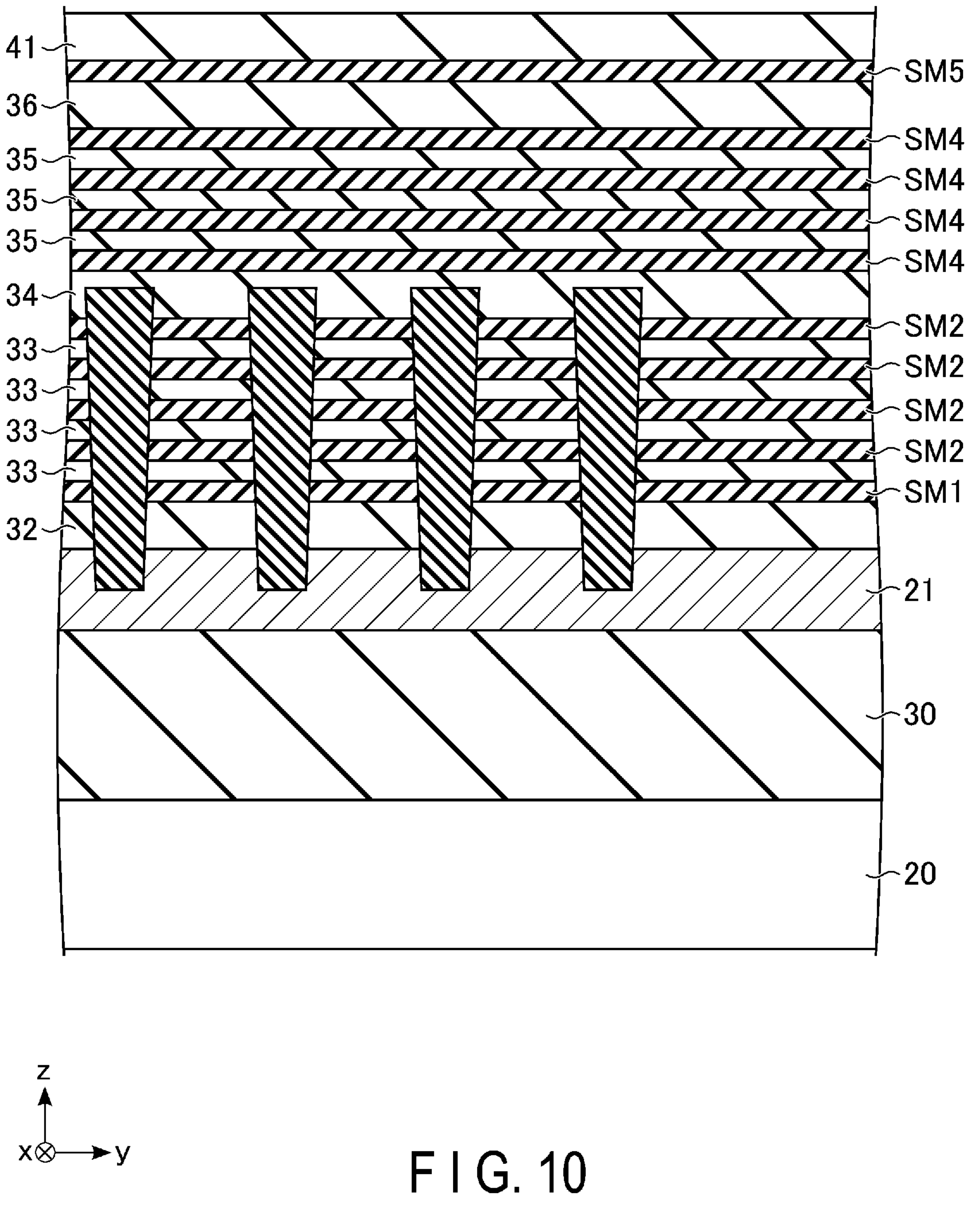
Figure 11:
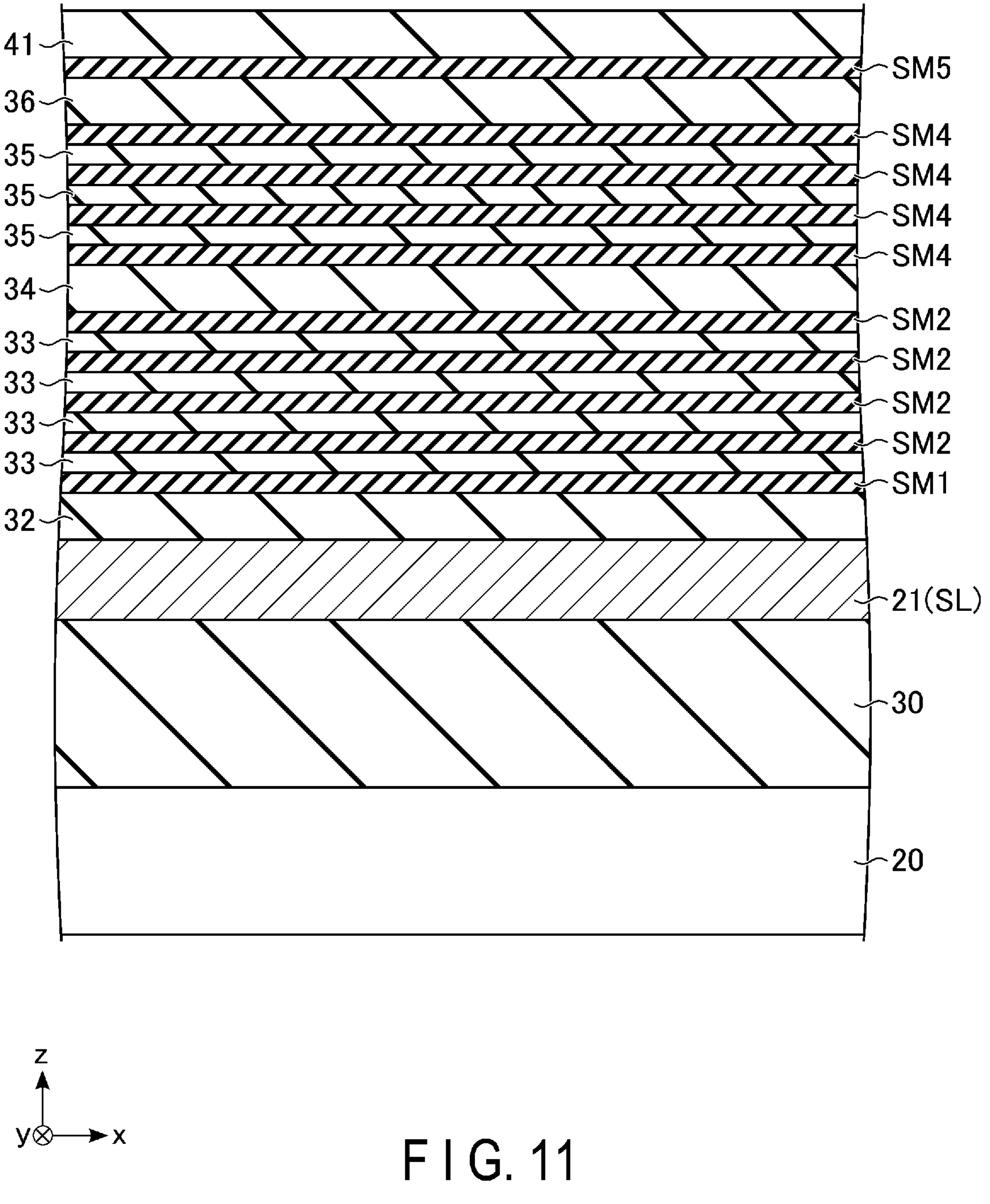

As shown in FIGS. 10 and 11, insulators SM4, 35, 36, SM5, and 41 are formed. Specifically, first the upper portion of the insulator 34 is deposited on the upper surface of the lower portion of the insulator 34 and the upper surface of the insulators SM3. Examples of the deposition method include CVD.

On the upper surface of the insulator 34, a single insulator 35 and a single insulator SM4 are alternately deposited for multiple layers. Each of the insulators SM4 occupies the area in which a single conductor 24 is slated to be formed. The insulator SM4 contains, for example, silicon nitride. Examples of the deposition method include CVD.

On the upper surface of the uppermost insulator SM4, the insulators 36, SM5, and 41 are deposited. The insulator SM5 occupies the area in which the conductor 25 is slated to be formed. Examples of the deposition method include CVD.

Figure 12:
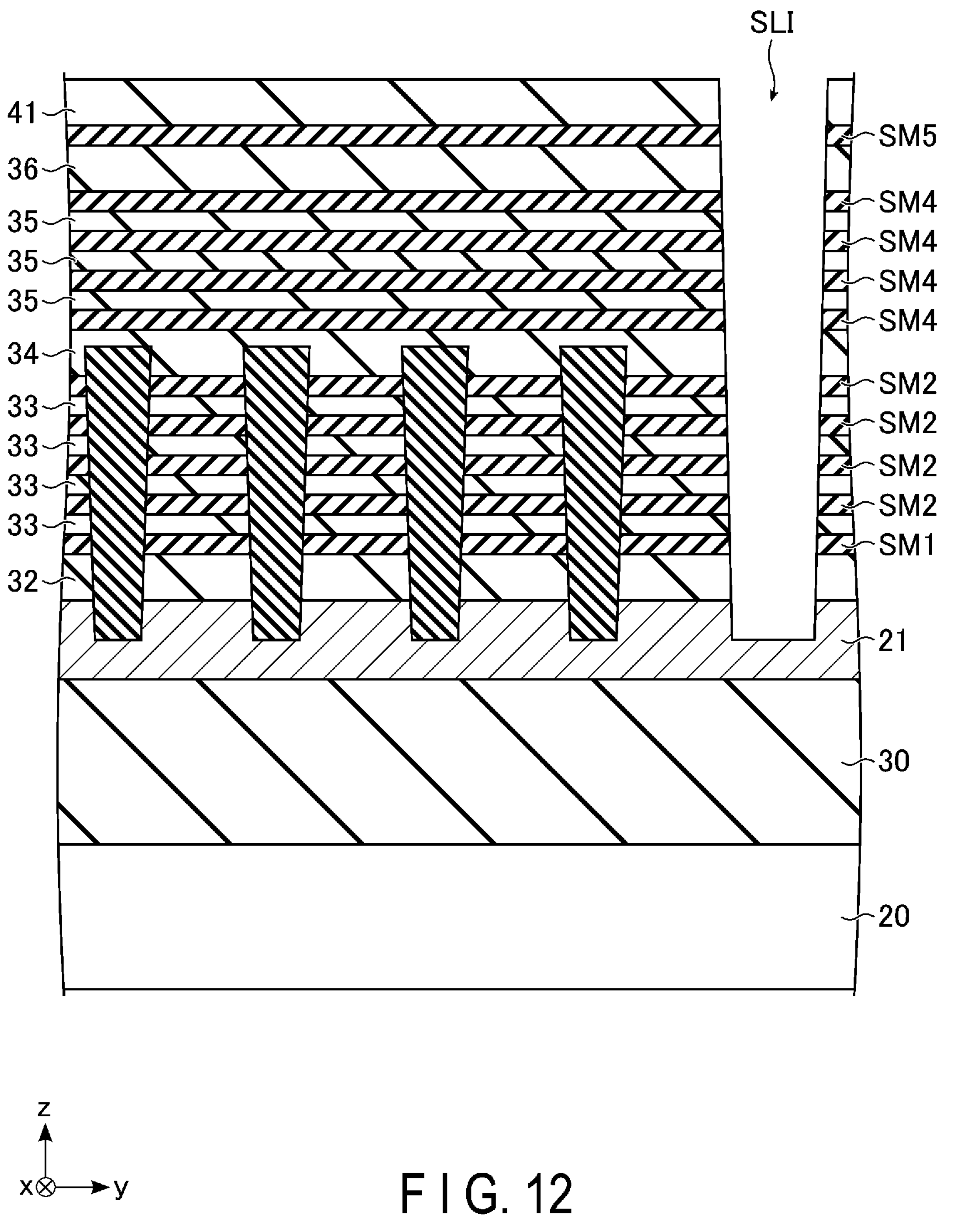
Figure 13:
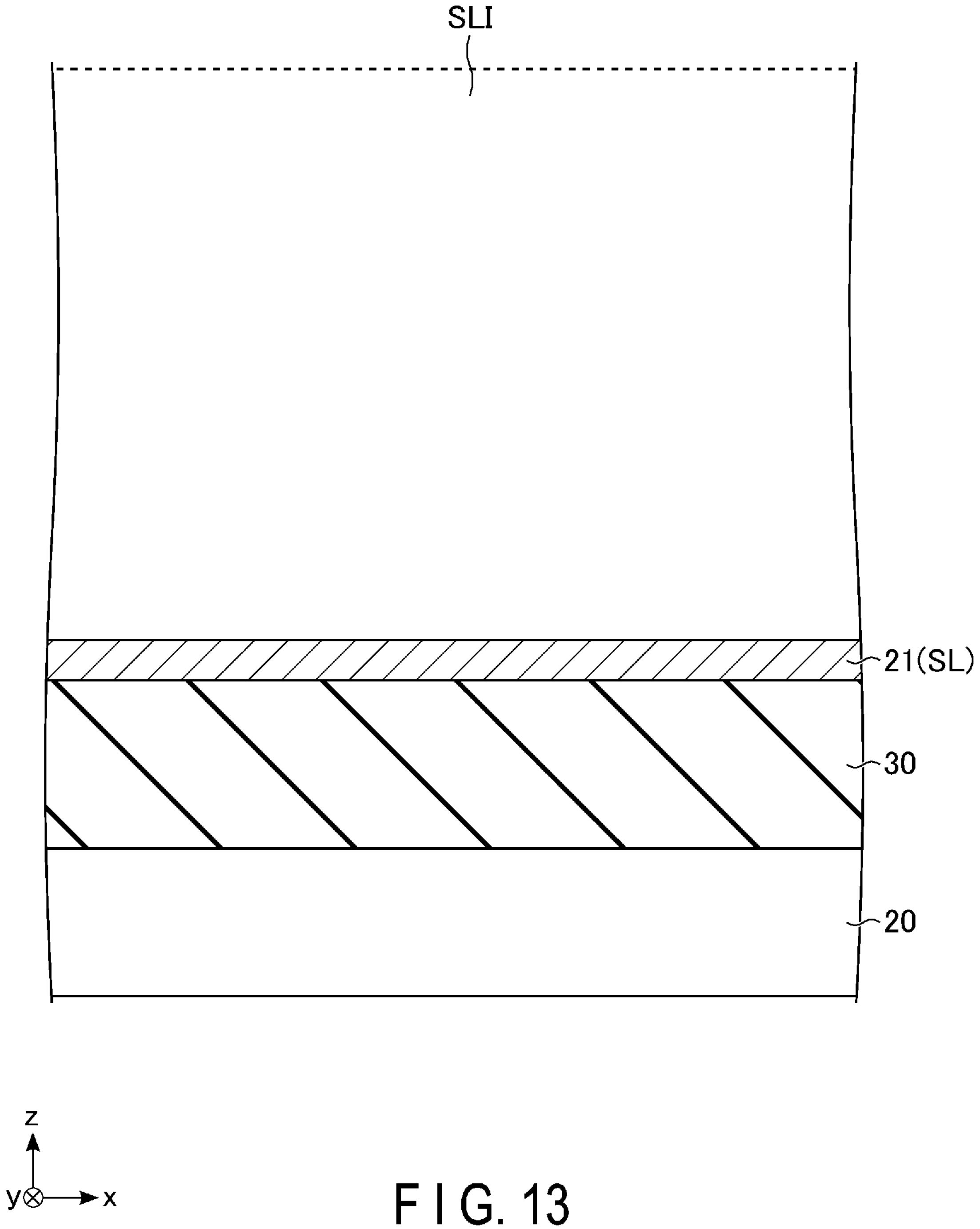

As shown in FIGS. 12 and 13, for example, by a photolithography process and anisotropic etching such as RIE, a slit is formed in the area in which the first portion SLTo of the member SLT is slated to be formed. The slit SLI penetrates the insulators 41, SM5, 36, SM4, 35, 34, SM2, 33, SM1, and 32, and the lower surface of the slit SLI is located within the conductor 21. The slit SLI extends in the x direction.

Figure 14:
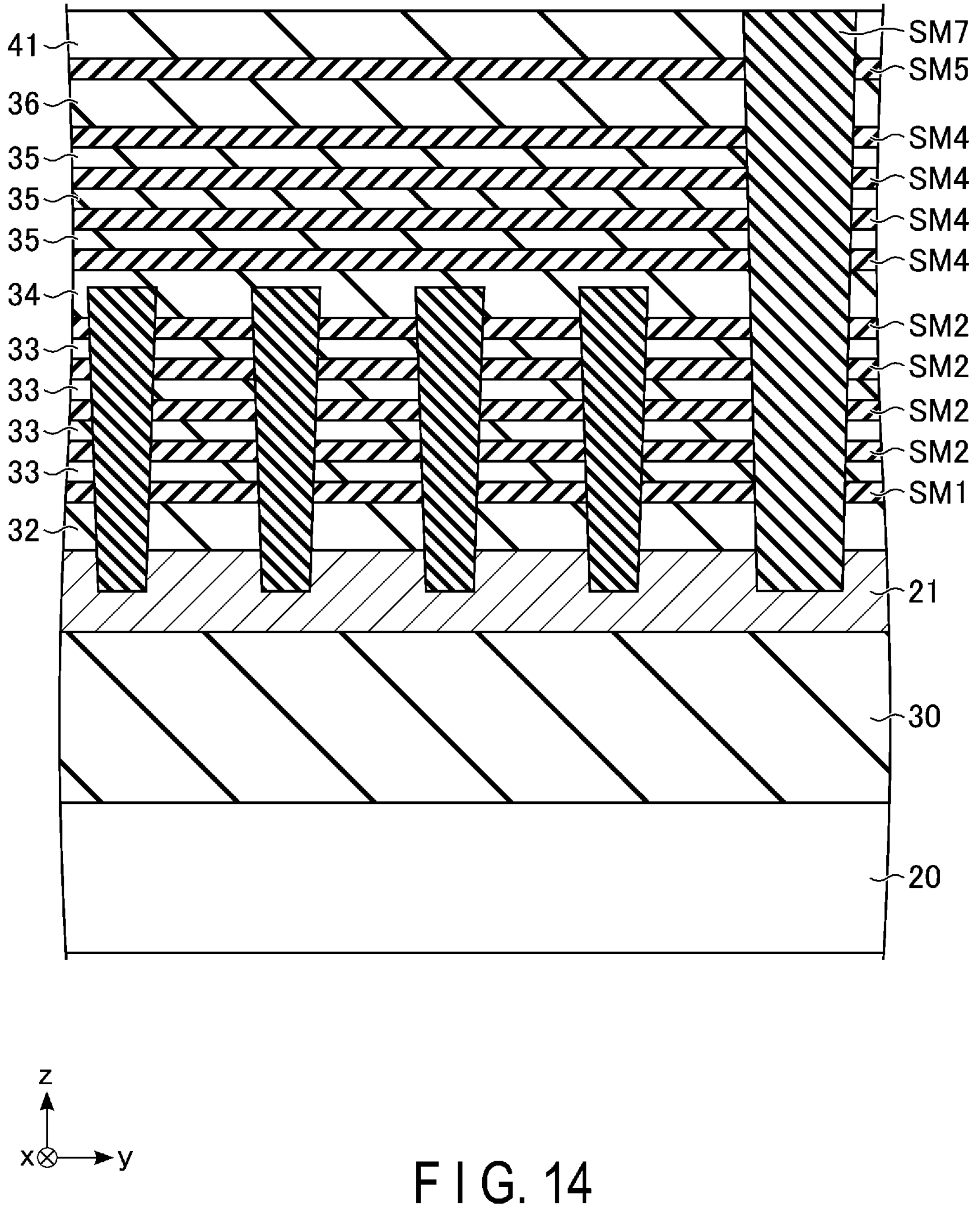
Figure 15:
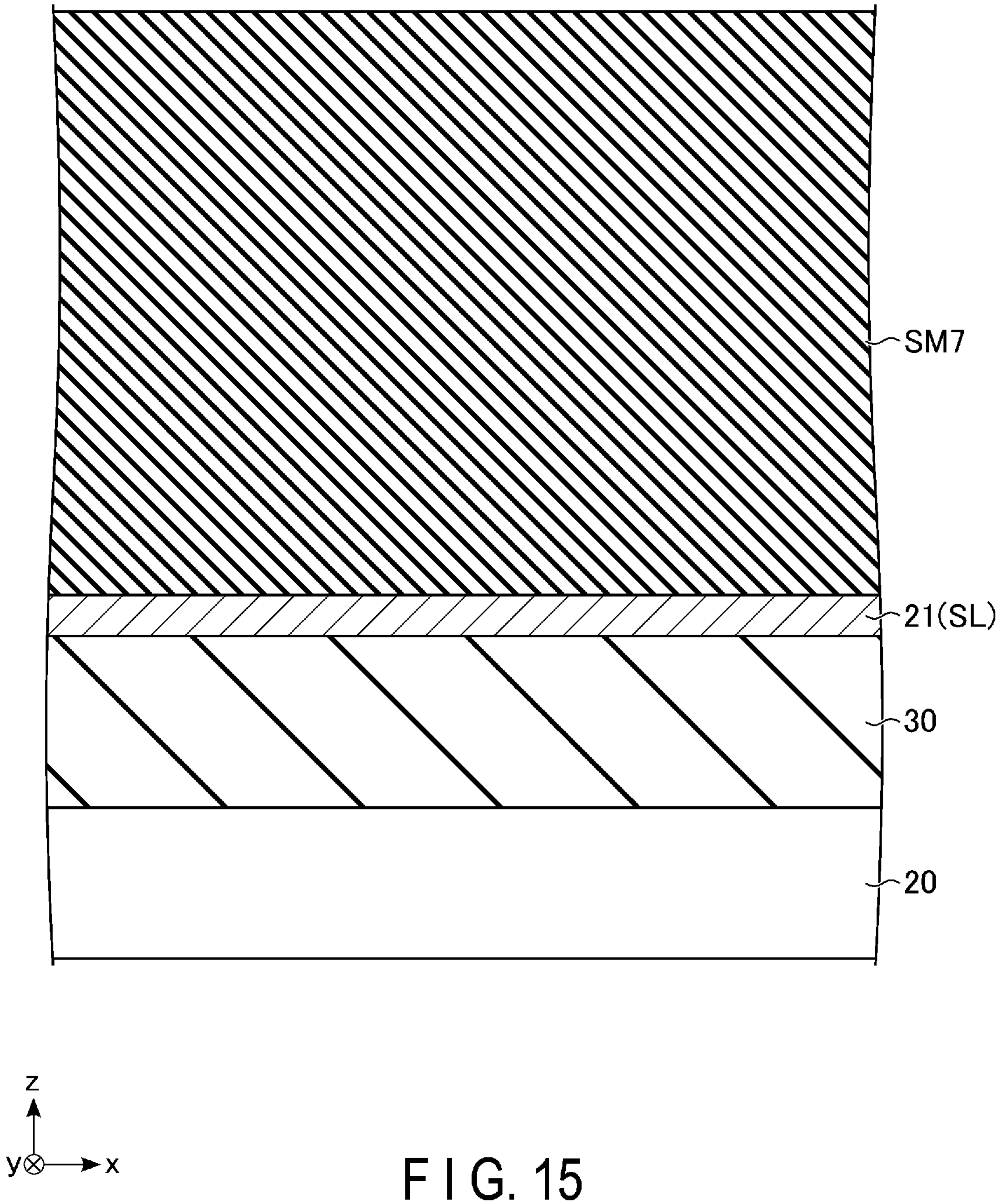

As shown in FIGS. 14 and 15, the slit SLI is filled with the insulator SM7. The insulator SM7 contains, for example, carbon, amorphous silicon, or a silicon oxide containing boron (boron-silicate glass, or BSG). Specifically, the insulator SM7 is deposited on the surface within the slit SLI and the upper surface of the insulator 41. Examples of the deposition method include CVD. Subsequently, the portion of the insulator SM7 on the upper surface of the insulator 41 is removed by chemical mechanical polishing (CMP), for example. As a result, the upper surface of the insulator 41 and the upper surface of the insulator SM7 are flat.

Figure 16:
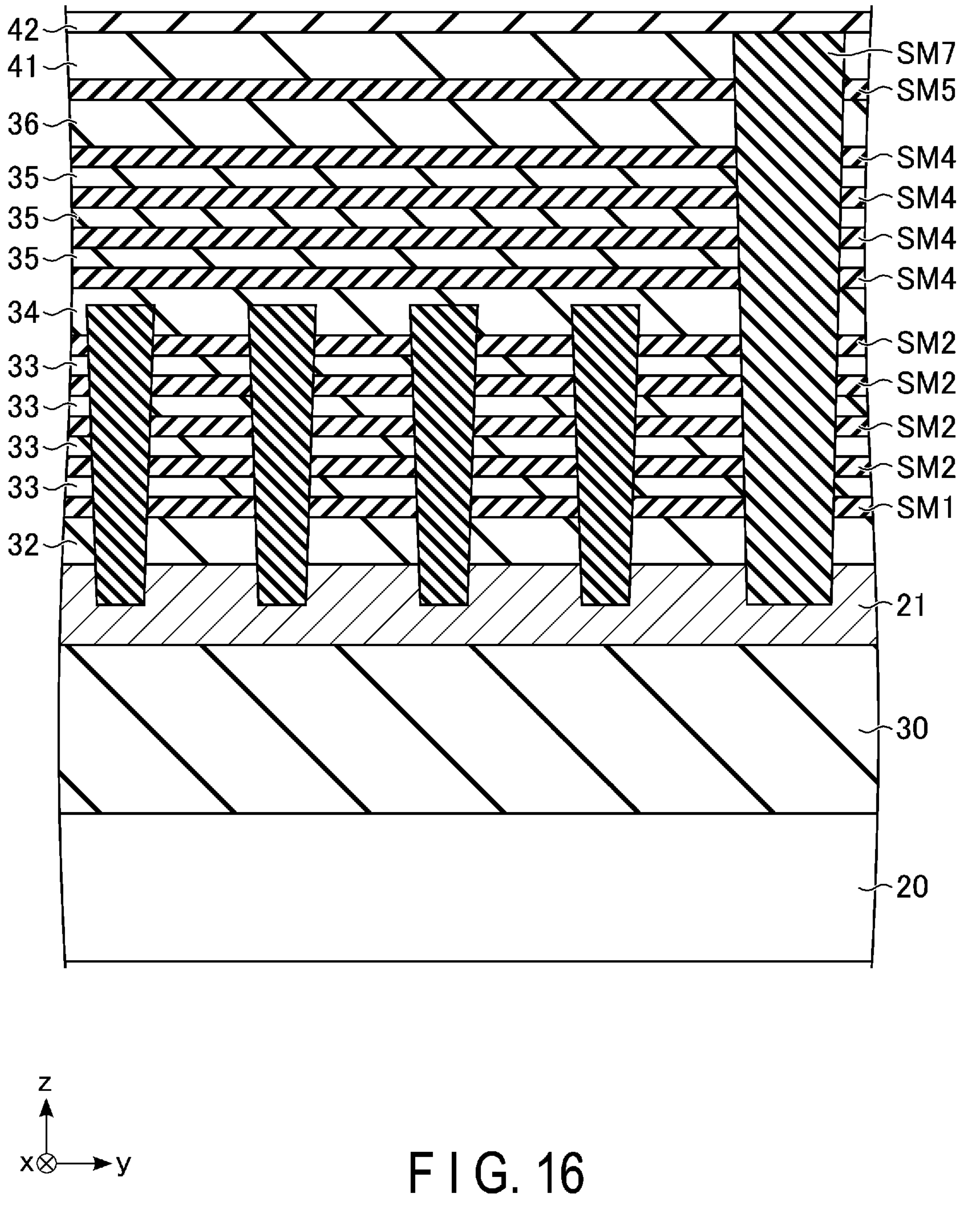
Figure 17:
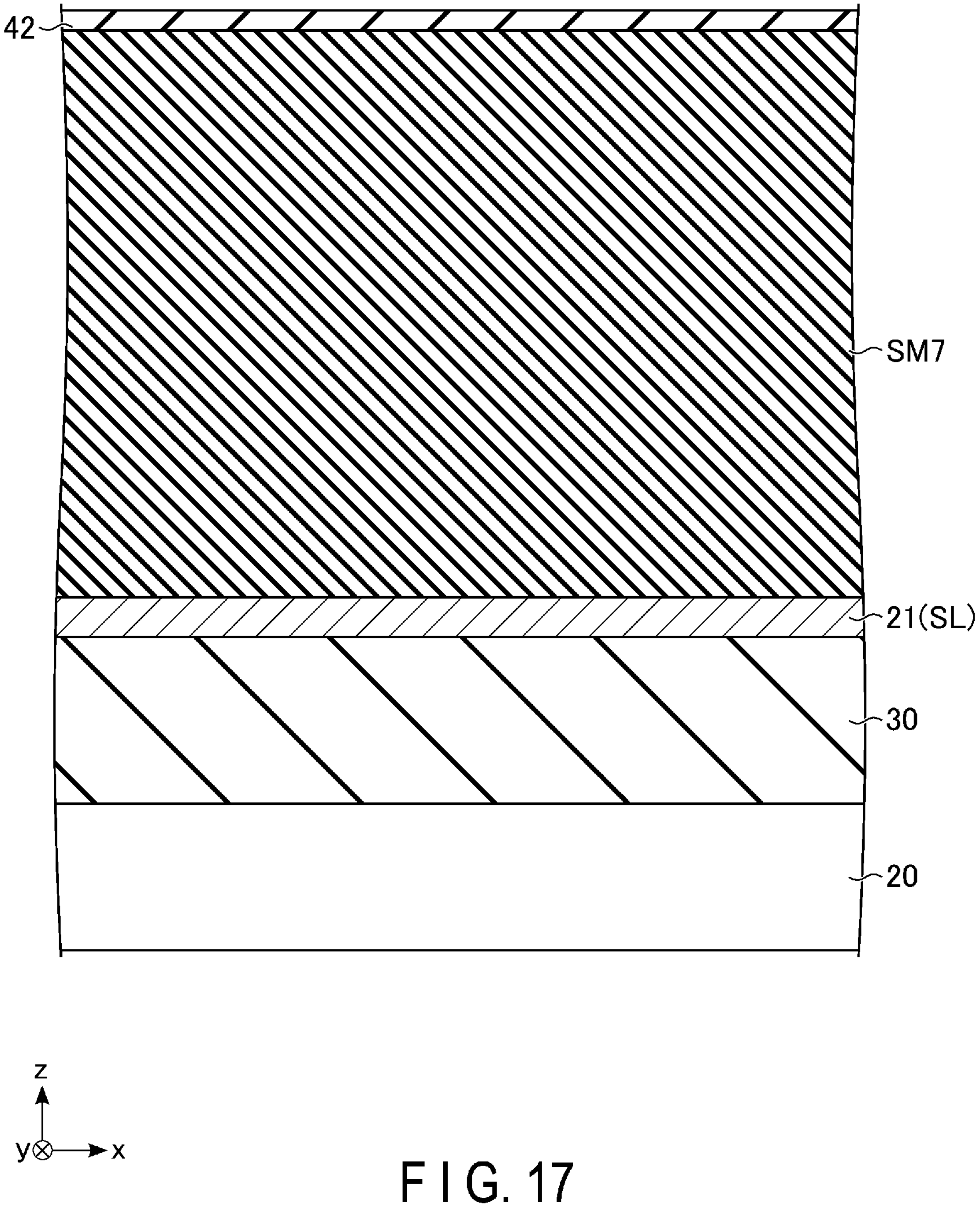

As shown in FIGS. 16 and 17, the insulator 42 is deposited on the upper surface of the insulator 41 and the upper surface of the insulator SM7. Examples of the deposition method include CVD. The insulator 42 is deposited on a flat base, in other words, a set of the upper surface of the insulator 41 and the upper surface of the insulator SM7. For this reason, the insulator 42 contains almost no void or completely no void.

Figure 18:
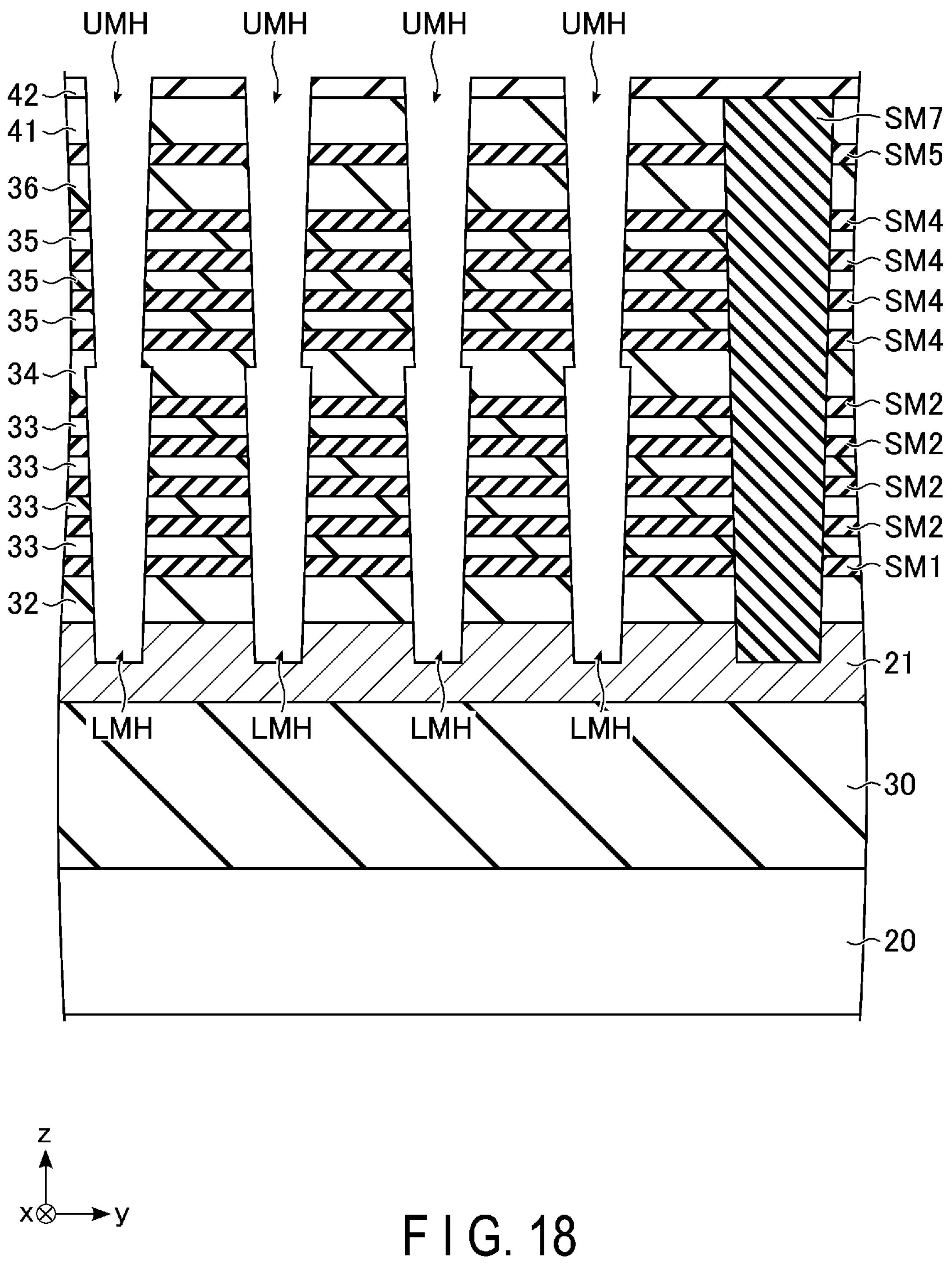

As shown in FIG. 18, the memory holes LMH and UMH are formed. Specifically, for example, memory holes UMH are first formed, by a photolithography process and anisotropic etching such as photolithography and RIE, in the areas in which the upper memory pillars UMP are slated to be formed. Each memory hole UMH penetrates the insulators 42, 41, SM5, 36, SM4, and 35, and the lower surface of each memory hole UMH is in contact with a single insulator SM3. Wet etching, for example, is subsequently performed, and the insulators SM3 are removed by a chemical solution that travels from the memory holes UMH. As a result of the removal of the insulator SM3, memory holes LMH are once again formed in the areas in which the insulators SM3 have been located.

Figure 19:
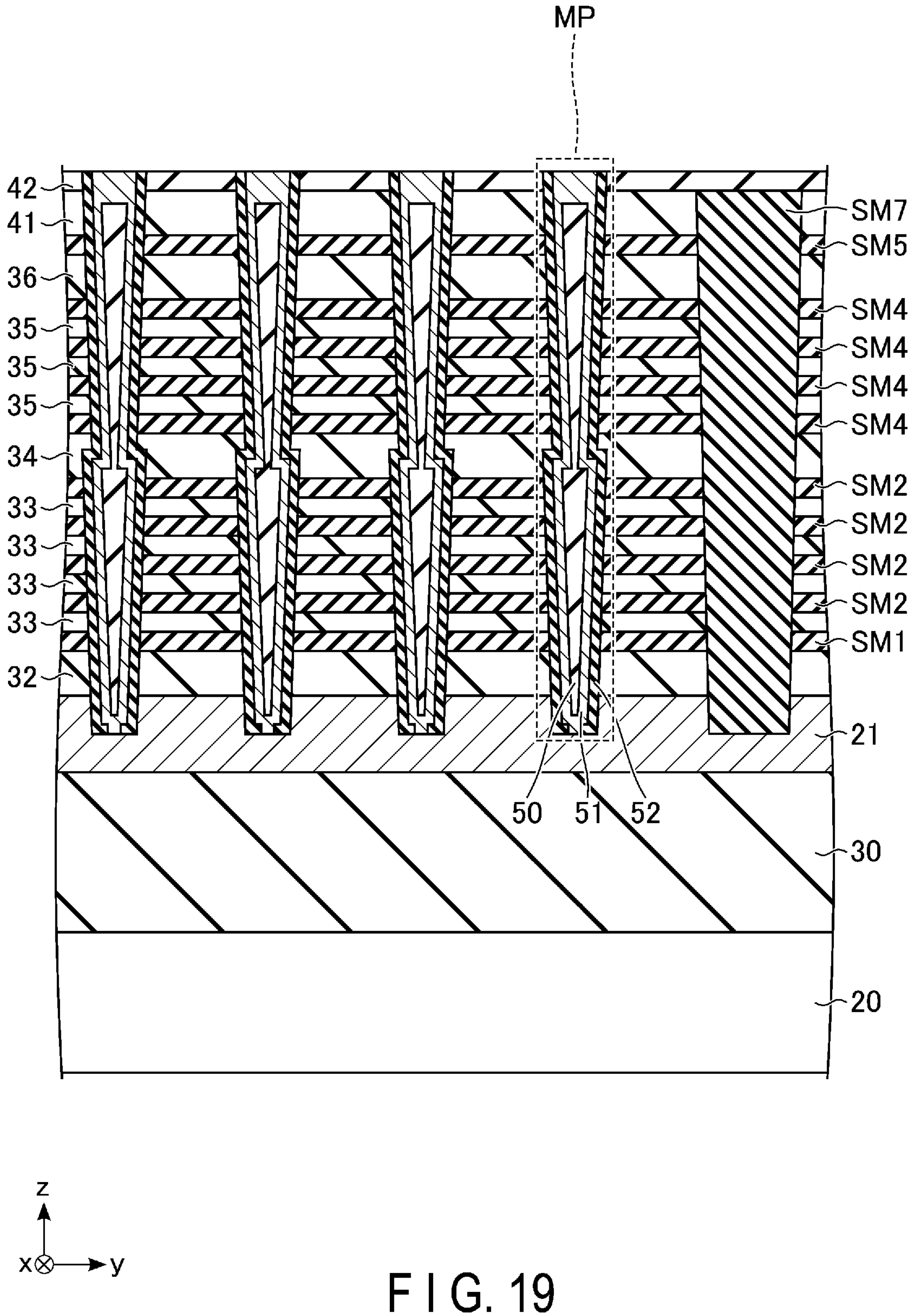

As shown in FIG. 19, memory pillars MP are formed. Specifically, a layer stack 52, namely a tunnel insulator 53, a charge storage layer 54, and a block insulator 55 are formed on the surfaces of the each set of memory holes UMH and LMH. Examples of the deposition method include CVD. An opening is formed in a portion of the layer stack 52 above the lower surface of each memory hole LMH, namely a portion above the conductor 21. The opening reaches the conductor 21.

A semiconductor 51 is deposited on the surface of the layer stack 52. A portion of the semiconductor 51 fills the opening of the layer stack 52. Examples of the deposition method include CVD. Through depositing the core 50 on the surface of the semiconductor 51, the center of the memory holes UMH and LMH are filled by the core 50. Examples of the deposition method include CVD. Thereafter, the upper part of the core 50 is removed, and the semiconductor 51 is formed in the removed part. The memory pillars MP are thus formed. The upper surface of the semiconductor 51 is flattened by, for example, CMP, together with the insulator 42 and the upper surface of the layer stack 52 (i.e., the upper surface of the memory pillar MP).

Figure 20:
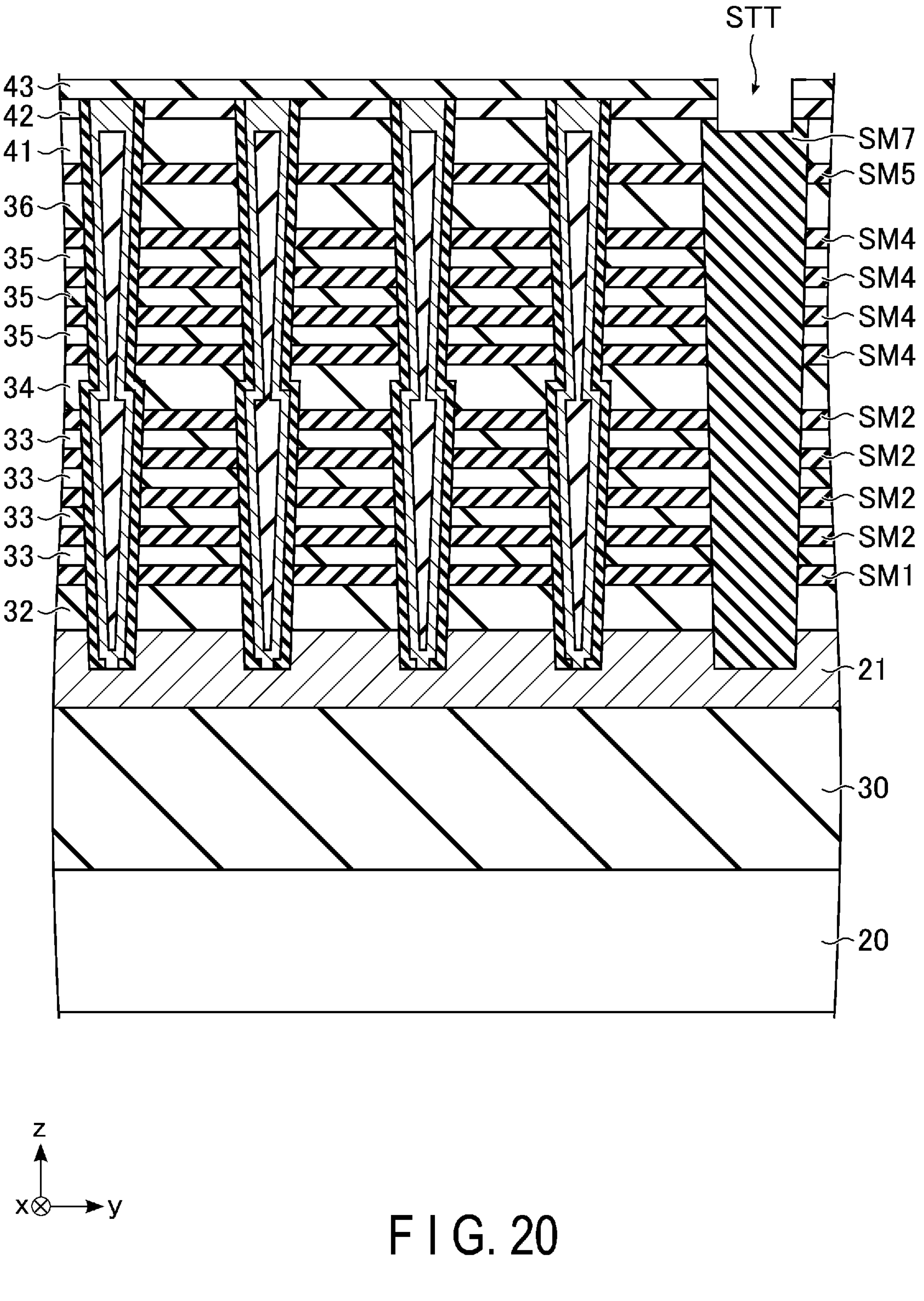
Figure 21:
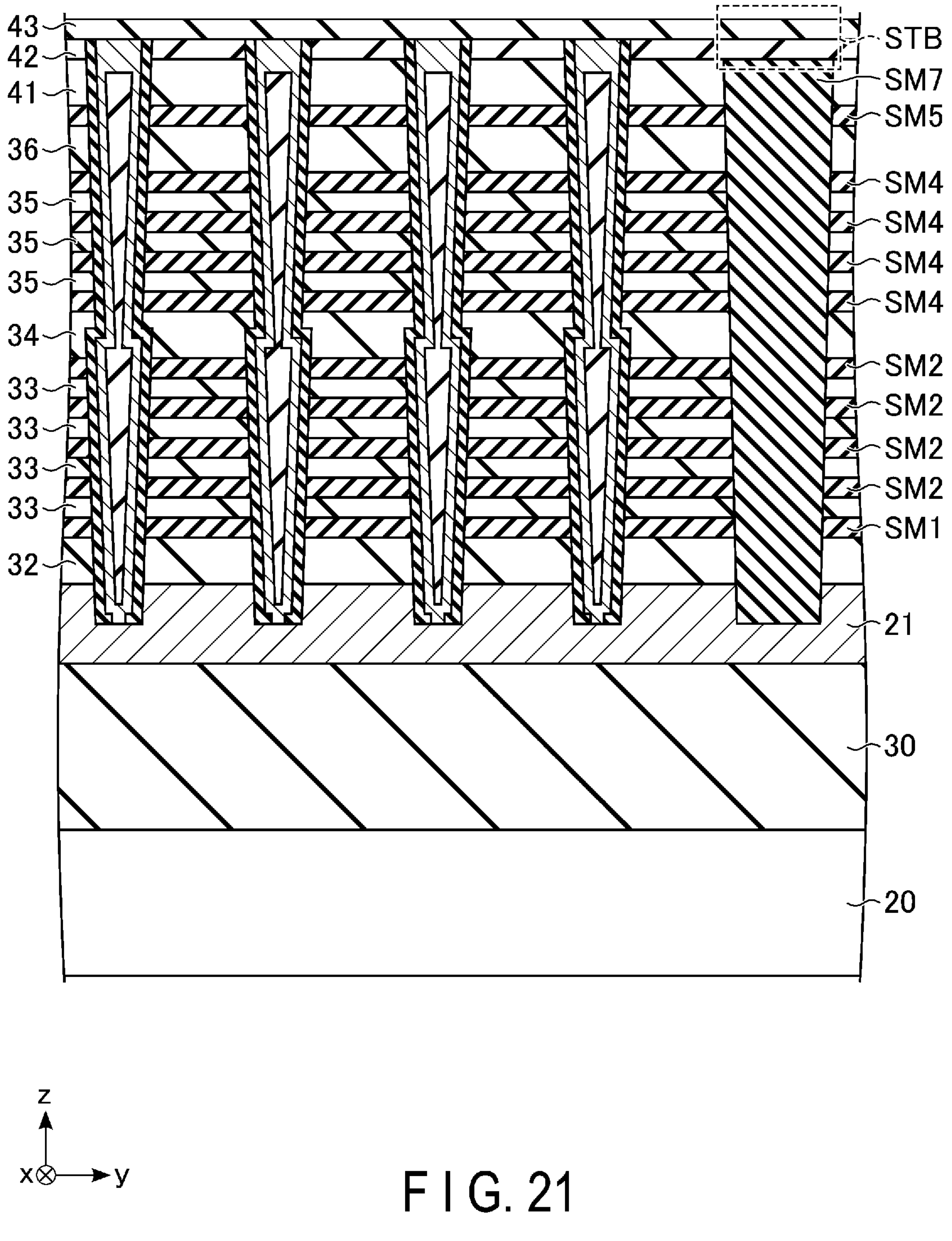
Figure 22:
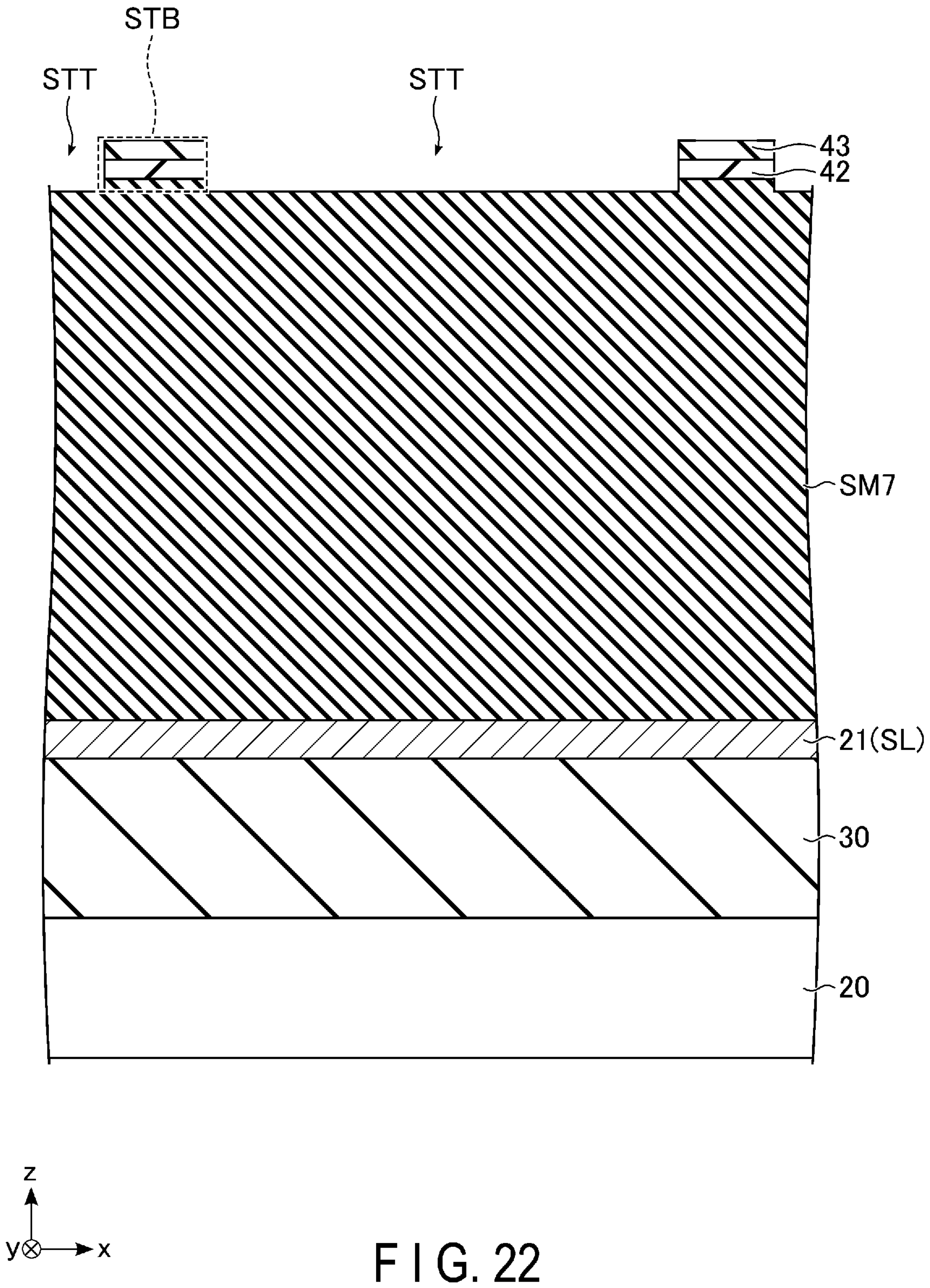

As shown in FIGS. 20, 21, and 22, an insulator 43, a trench STT, and a bridge STB are formed. Specifically, an insulator 43 is first deposited on the upper surface of the insulator 42, the upper surfaces of the memory pillars MP, and the upper surface of the insulator SM7. Examples of the deposition method include CVD. As described above with reference to FIG. 19, the upper surfaces of the memory pillars MP and the upper surface of the insulator 42 are flattened. For this reason, the insulator 43 is deposited on this flat base, in other words, a set of the upper surfaces of the memory pillars MP and the upper surface of the insulator 42. For this reason, the insulator 43 contains almost no void or completely no void.

A slit STT is formed by, for example, photolithography and anisotropic etching such as RIE, in the area in which a second portion SLTt of the member SLT is slated to be formed. The trench STT penetrates the insulators 43 and 42 and reaches the insulator SM7. The y dimension of the trench STT are smaller than that of the insulator SM7. The etching for forming the trench STT may be performed under over-etching conditions, for example. For this reason, the lower surface of the trench STT is located slightly below the upper surface of the insulator 41.

A set of the insulators 42 and 43 partially remains in the area in which the trench STT is not formed in the portion on the upper surface of the insulator SM7. The remaining portion functions as a bridge STB. In other words, a bridge STB is formed through formation of a trench STT.

Figure 23:
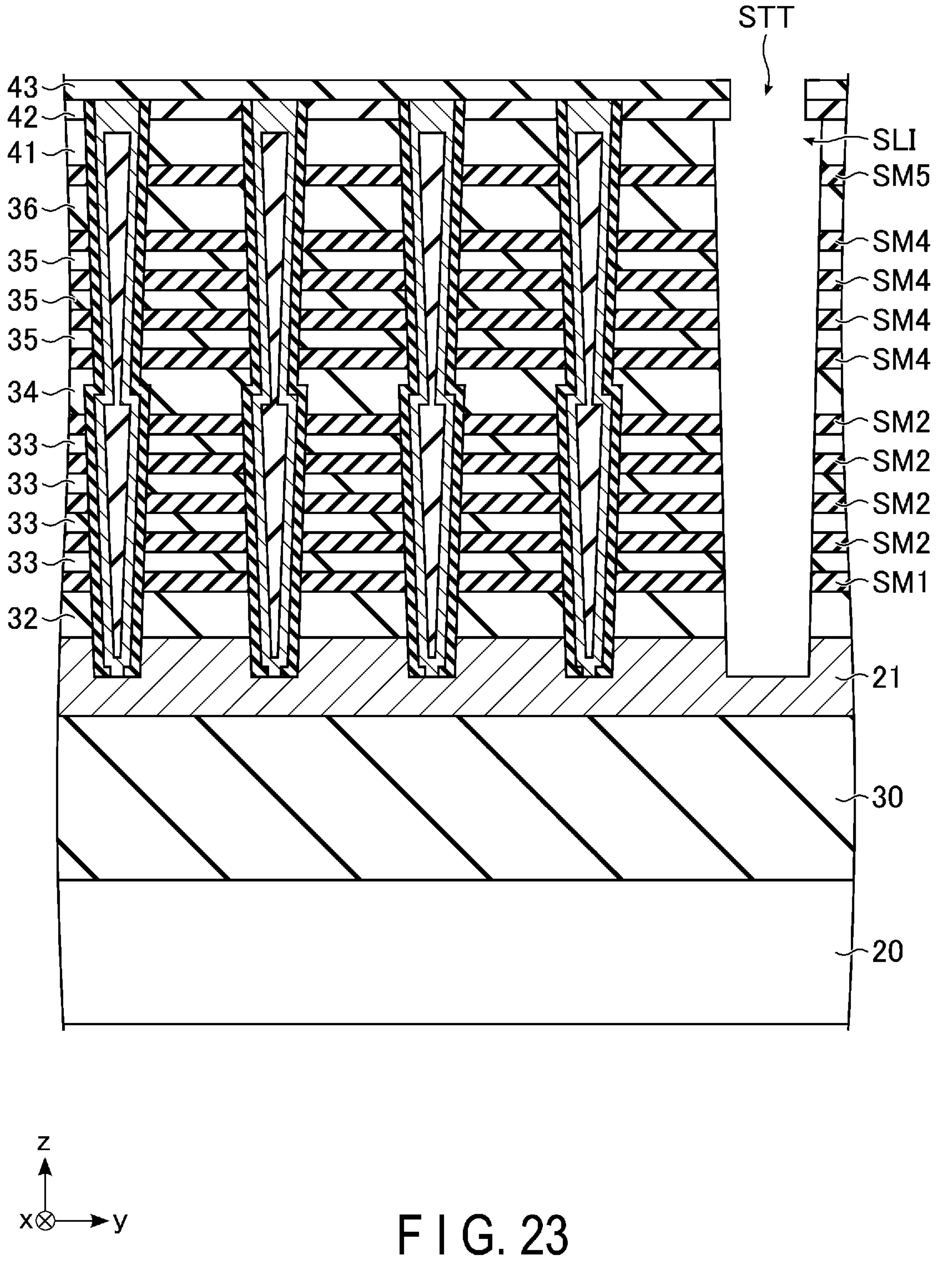
Figure 24:
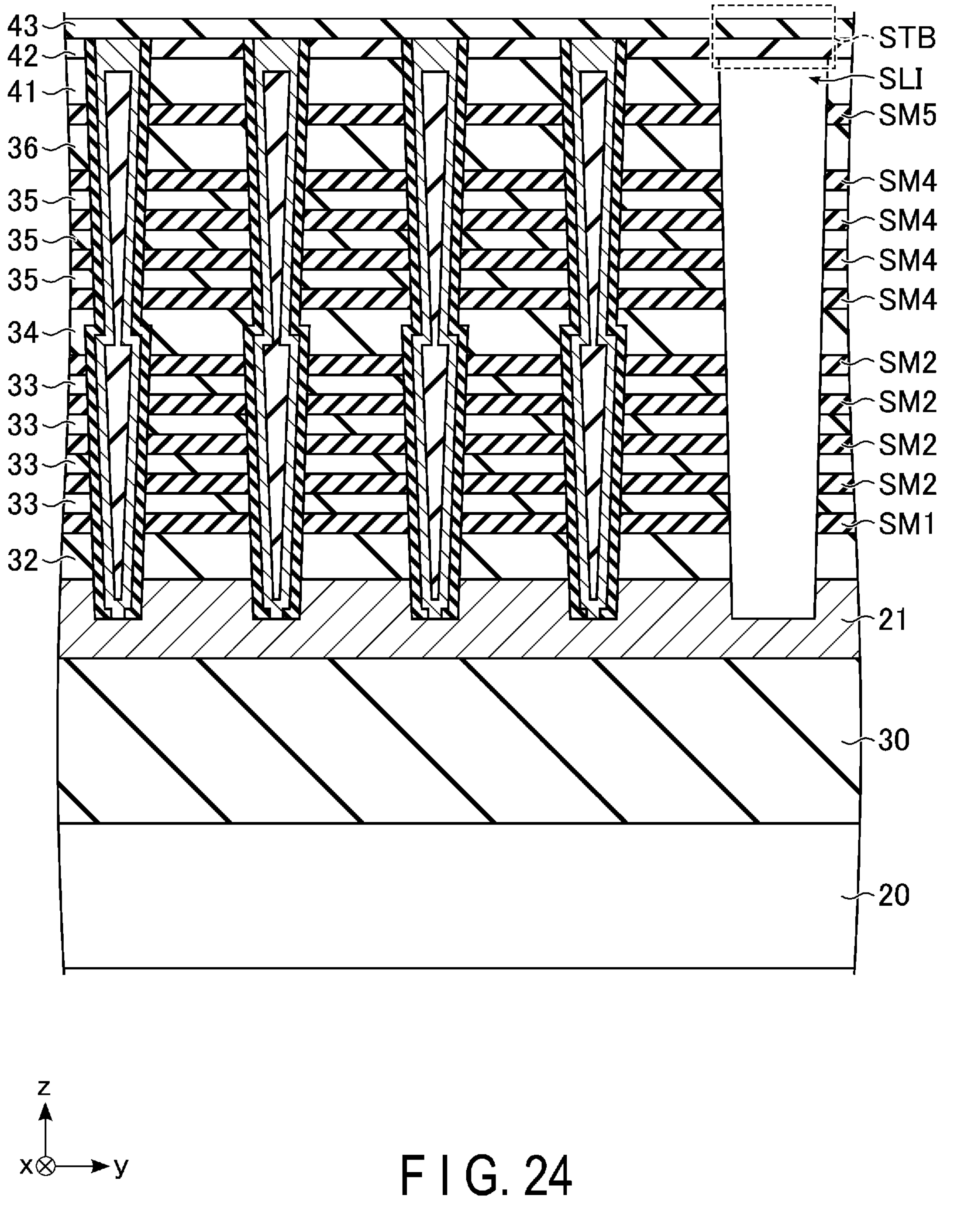
Figure 25:
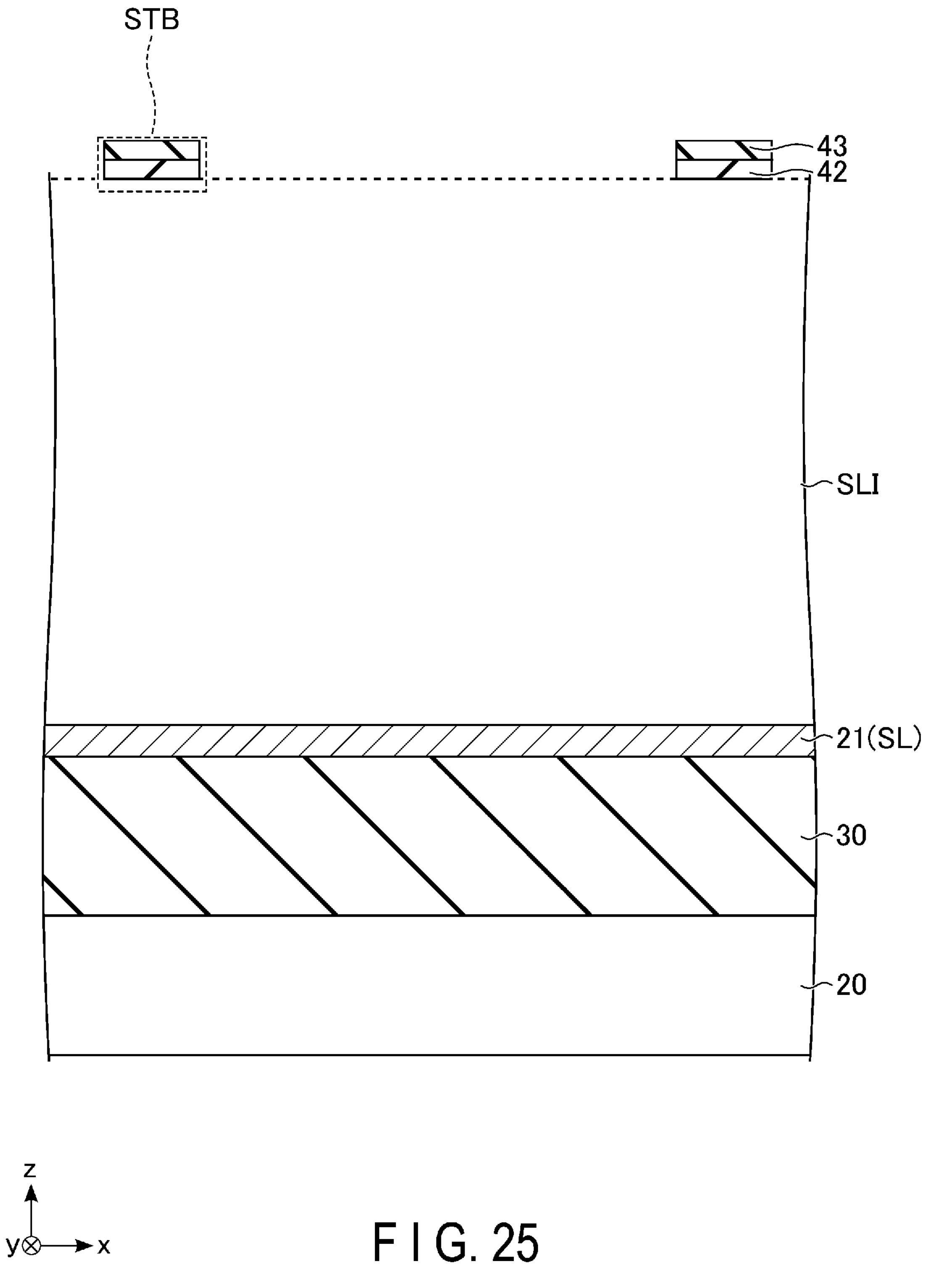

As shown in FIGS. 23, 24, and 25, the insulator SM7 is removed. Examples of the removal method include wet etching or removal using a gas. As the chemical solution used in wet etching or the gas, a chemical solution or gas having selectivity to the insulator SM7 and a set of the insulators 43 and 42 is used. In other words, the chemical solution or the gas reacts with the insulator SM7 and does not react with the set of the insulators 43 and 42. The chemical solution or the gas is in contact with the insulator SM7 below the trench STT and removes the insulator SM7. The chemical solution or the gas does not remove the set of the insulators 43 and 42. For this reason, the bridge STB remains. Examples of the gas include a gas-phase (or, vaporlike) hydrofluoric acid.

Figure 26:
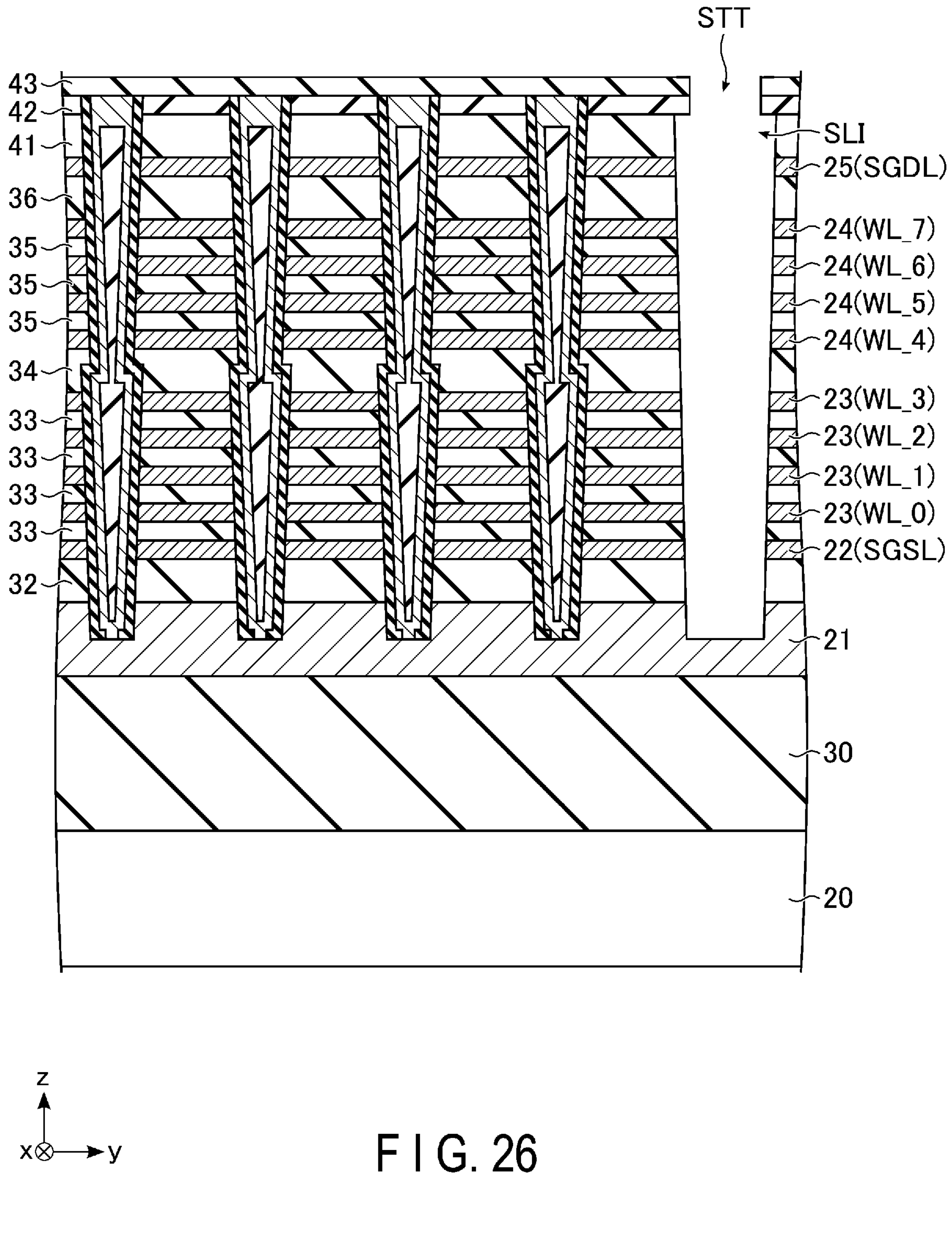

As shown in FIG. 26, the insulators SM1, SM2, SM4, and SM5 are replaced with the conductors 22, 23, 24, and 25, respectively. Specifically, the insulators SM1, SM2, SM4, and SM5 are removed first. Examples of the removal method include wet etching. The chemical solution of wet etching reaches the insulators SM1, SM2, SM4, and SM5, and removes the insulators SM1, SM2, SM4, and SM5 through the slit SLI. As a result, a space is formed in the area in which the insulators SM1, SM2, SM4, and SM5 have been located. Next, the conductors 22, 23, 24, and 25 are formed in the space. Examples of the formation of the conductors 22, 23, 24, and 25 include CVD.

Figure 27:
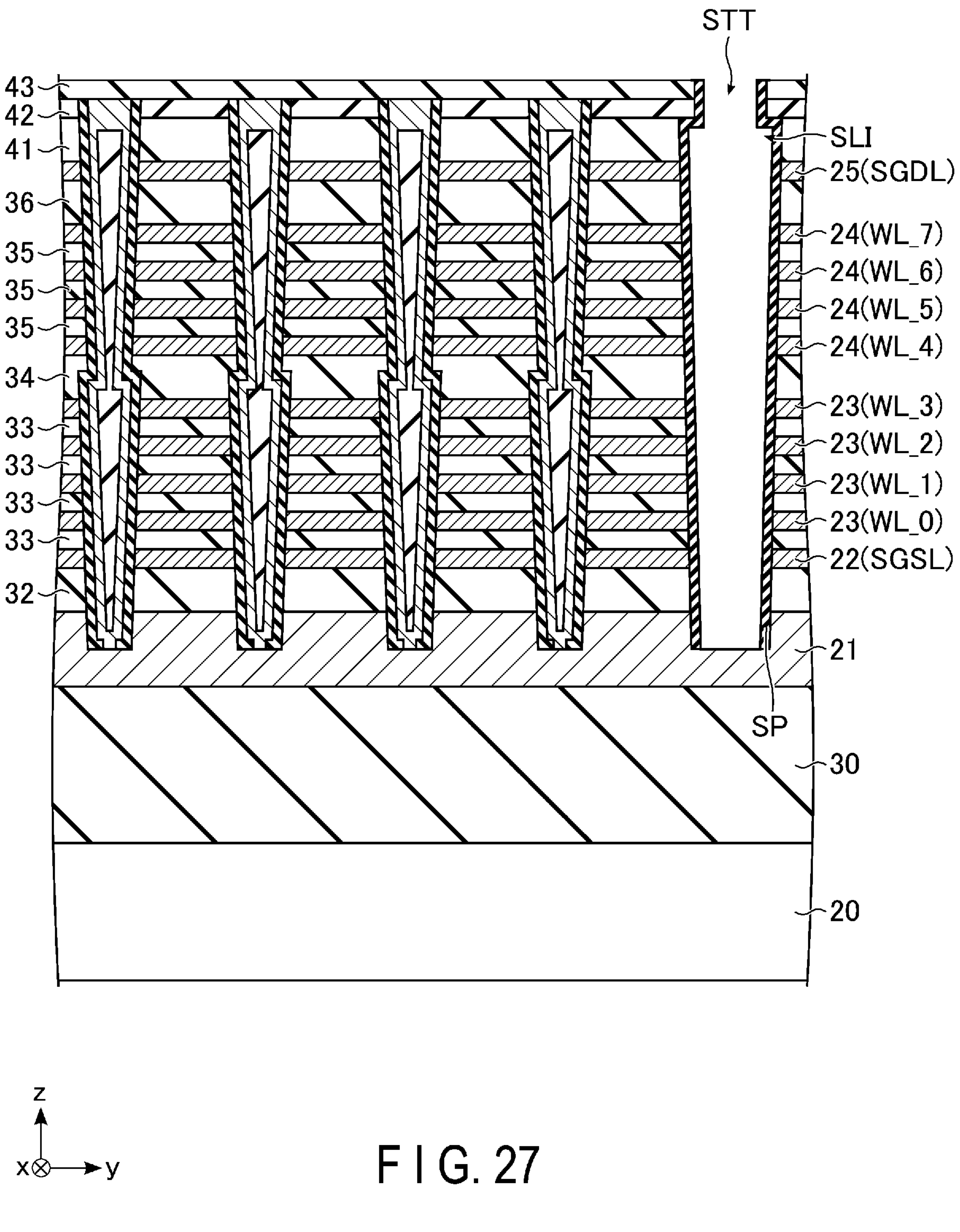
Figure 28:
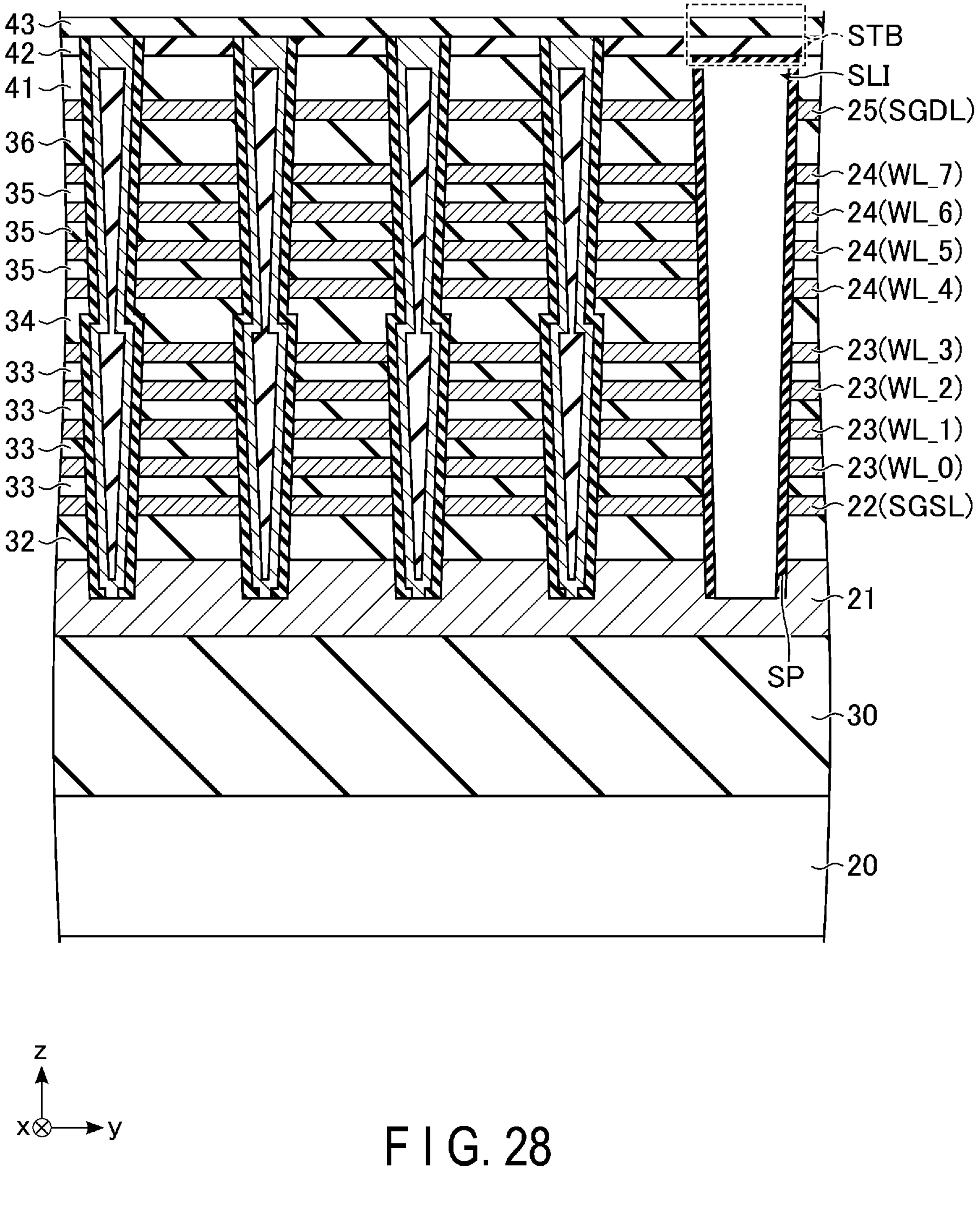

As shown in FIGS. 27 and 28, the insulator SP is formed. Examples of the formation include CVD. The material gas of the insulator SP travels from the opening of the trench STT and enters the slit SLI. As a result, an insulator SP is deposited on the surface of the trench STT and the surface of the slit SLI. In other words, an insulator SP is formed on the side surface of the trench STT, namely the side surface of the bridge STB. The material gas travels from the trench STT toward the portion below the bridge STB, and the insulator SP is formed on the lower surface of the bridge STB. The material gas is formed into the insulator SP on the side surface and the bottom surface of the slit SLI. The insulator SP is continuous over, for example, the side surface of the trench STT (i.e., the side surface of the bridge STB), the lower surface of the insulator 42 (including the lower surface of the bridge STB), and the side surface and the bottom surface of the slit SLI.

Subsequently, the portion of the insulator SP on the bottom surface of the slit SLI is removed. As a result of this removal, a portion of the conductor 21 is exposed on the bottom surface of the slit SLI. Examples of the removal method include anisotropic etching such as RIE.

Figure 29:
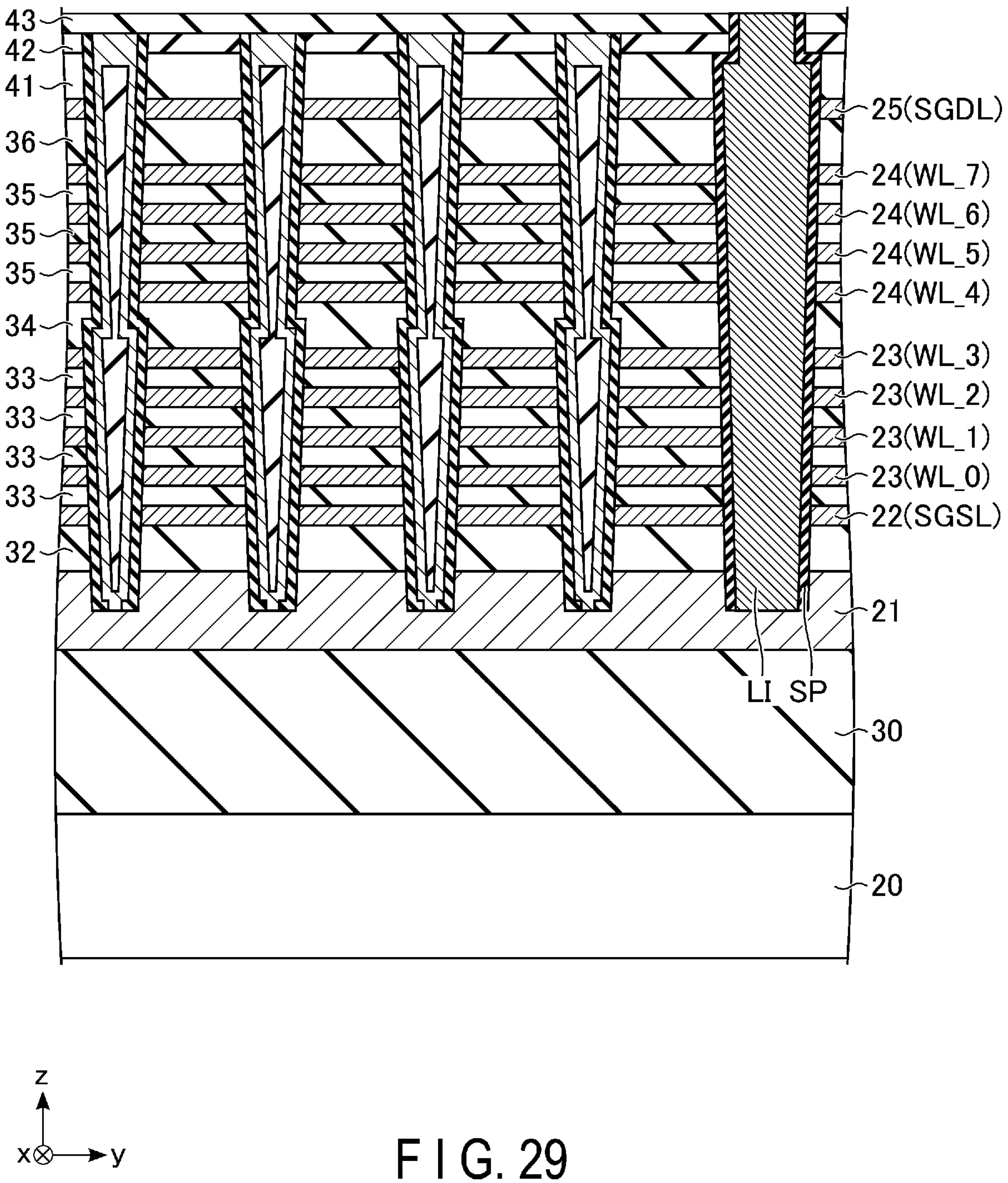
Figure 30:
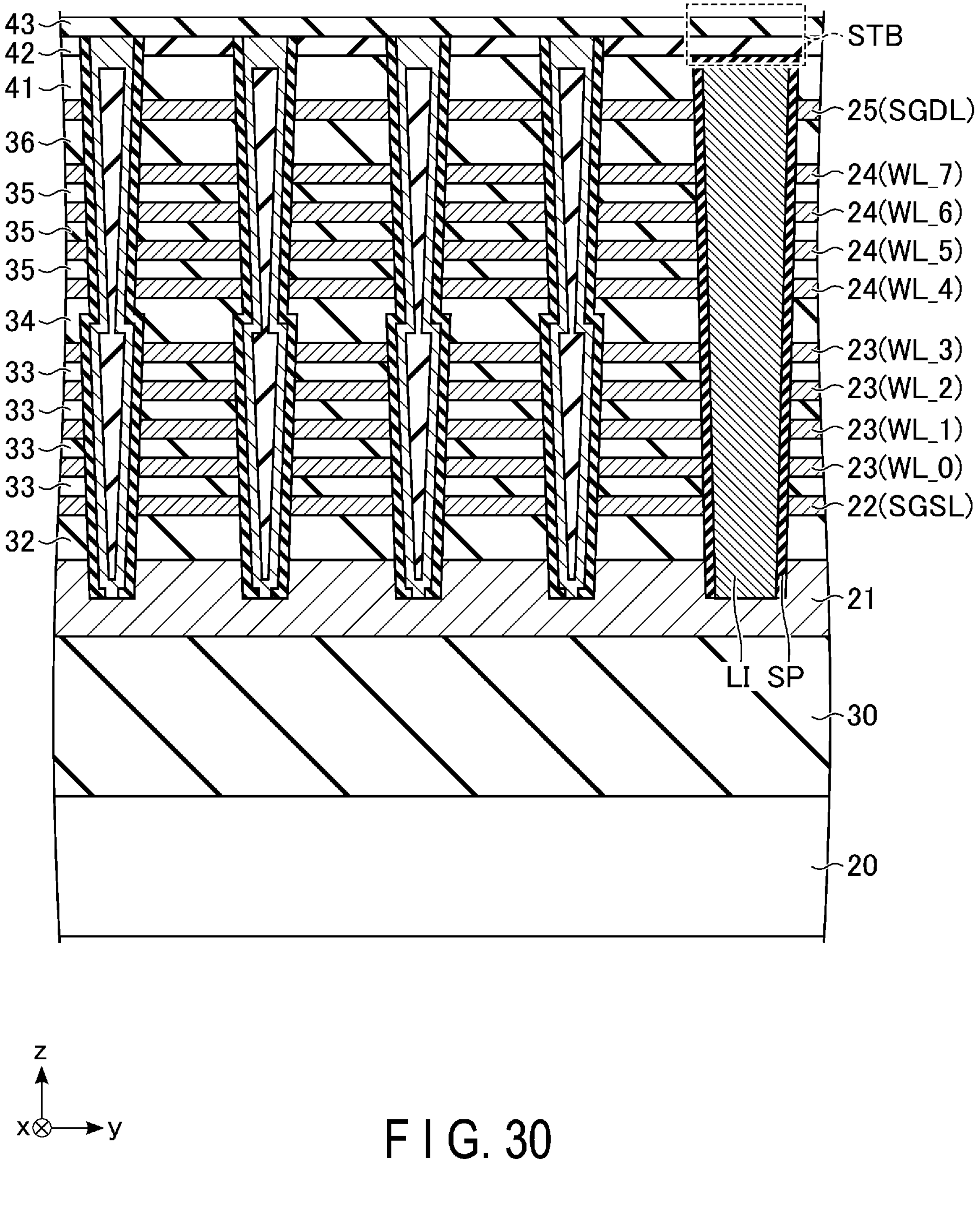
Figure 31:
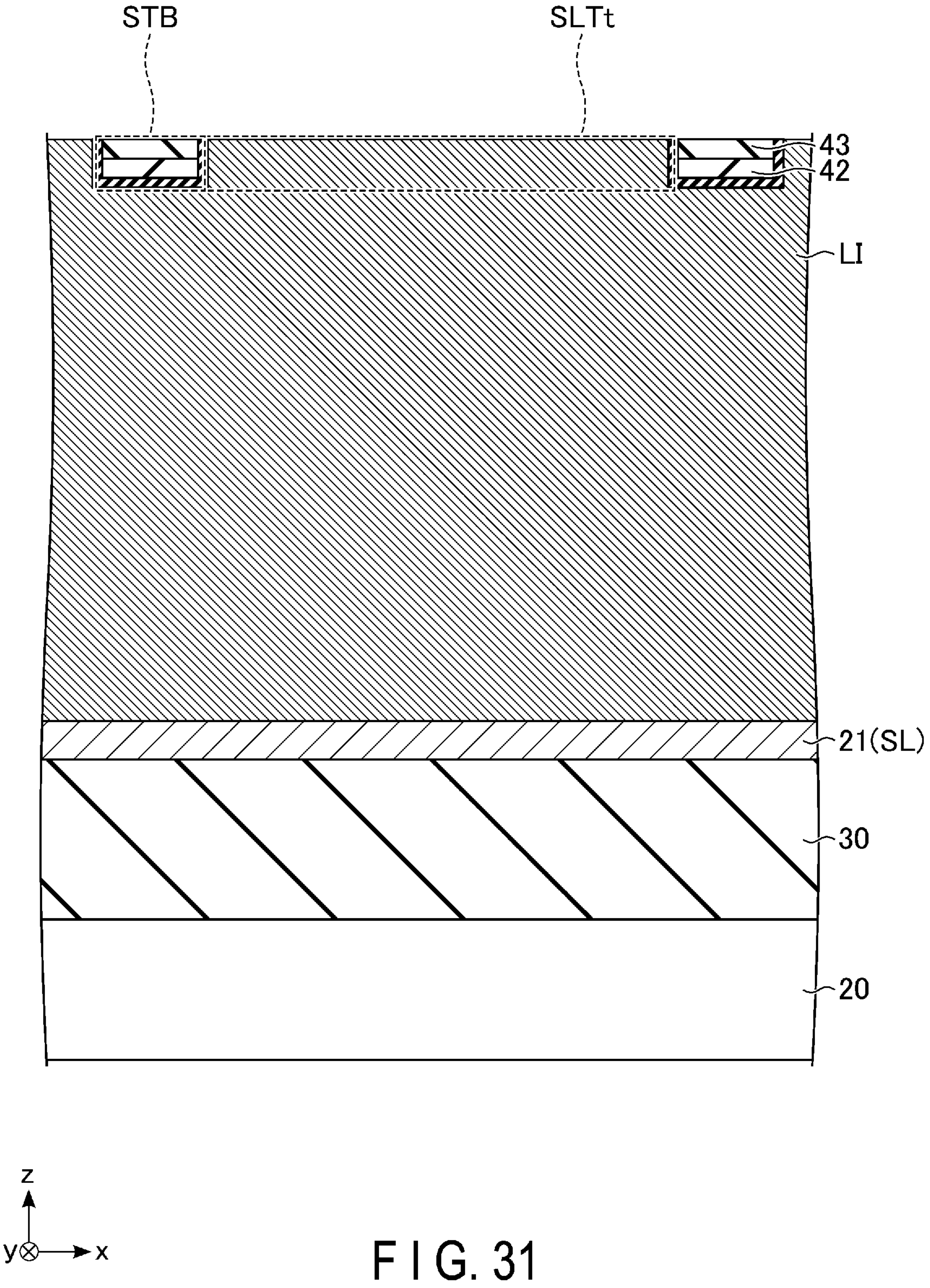

As shown in FIGS. 29, 30, and 31, the conductor LI is formed. Specifically, the conductor LI is deposited on the surface of the insulator SP in the slit SLI and the trench STT. As the deposition progresses, the conductor LI fills the area in which the insulator SP is not provided in the slit SLI and the trench STT, for example.

As shown in FIGS. 4, 5, and 6, the member SHE, the insulator 45, the contact plug CV, and the conductor 27 are formed.

1.3. Advantages (Advantageous Effects)

According to the first embodiment, a memory device having a bridge in which formation of a void is suppressed or prevented can be provided, as described below.

In order to maintain the structure in a state where the insulators SM1, SM2, SM4, and SM5 are removed in the process described above with reference to FIG. 26, the following reference structure and reference manufacturing process are possible. An buried bridge having the same function as the bridge STB may be provided. The buried bridge can be provided by forming a sacrificial member corresponding to the slit SLT that does not include the bridge STB, forming a trench in the sacrificial member in the area in which the buried bridge is slated to be formed, depositing an insulator for the buried bridge in the trench, and removing the sacrificial member. The insulator is deposited as the thickness thereof increases on the surface of a target on which the insulator is deposited. As a result of the deposition of the insulator from the side surface of the trench toward the center of the trench, the insulator may close the opening of the trench before the center of the trench is filled. In this case, an area in which no insulator is present (or, void) may be formed in the buried bridge. The strength of this buried bridge having a void is low and the buried bridge may be insufficient to maintain the structure of a memory device during manufacturing.

Furthermore, by etch back process for partially removing the upper surface of the insulator for the buried bridge to expose the sacrificial member outside the area in which the buried bridge is slated to be formed, the void may open on the upper surface of the buried bridge and the bottom of the opening may reach the sacrificial member. As a result, if residue of a conductor occurs in the buried bridge in the following process of forming conductors, an unintended electric short-circuit may be caused in this portion.

According to the first embodiment, the bridge STB includes almost no or completely no void in the inside. For this reason, a bridge STB with a high strength can be realized, and a memory device 1 having a structure in which differences from an intended structure due to an unintended deformation in a structure during a manufacturing process are suppressed can be realized.

Including almost no or completely no void in the inside of the bridge STB is done on the grounds that the bridge STB is not formed by depositing an insulator in a trench. In other words, the bridge STB is made of a part of the insulator 42 formed on the upper surfaces of the flattened insulators 41 and SM7 and a part of the insulator 43 formed on the upper surfaces of the flattened memory pillars MP and the insulator 42. The insulators 42 and 43 formed on a flattened base in the above-described manner contain almost no void or completely no void. For this reason, the bridge STB contains almost no void or completely no void.

Furthermore, the bridge STB does not include an opening that may be formed in a reference memory device. For this reason, an electric short-circuit caused by a conductor that is unintentionally formed in the opening does not occur.

The bridge STB is a part of a set of stacked insulators 42 and 43. Generally, it is desired that a bridge have a certain thickness in order to maintain a structure of a memory device during manufacturing, whereas the insulator 42 for covering the insulator SM7 during manufacturing also functions as the lower part of the bridge STB. Thus, it is possible to realize a desirable thickness for the bridge STB even if the insulator 43 is thin. This leads to suppression of the thickness of an insulator positioned above the memory pillars MP, and in turn simplification of the manufacturing process, for example, facilitating the formation of a member SHE and/or a contact plug CV.

1.4. Modifications

Figure 32:
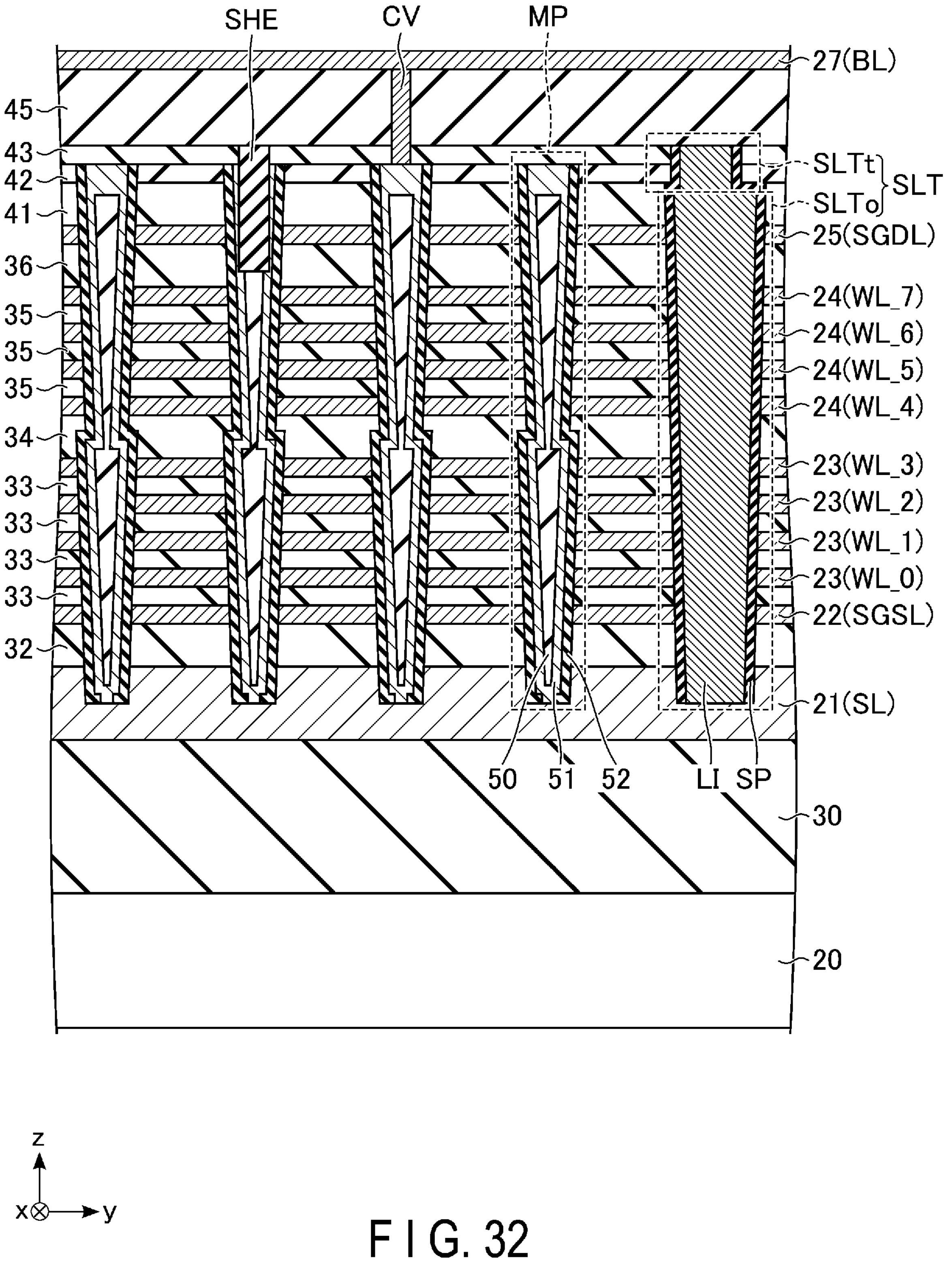
FIG. 32 shows an example of a cross-sectional structure of a part of a memory cell array in a memory device according to a first modification of the first embodiment.

As described above with reference to FIGS. 20, 21, and 22, the second portions SLTt of the slit SLT are formed in the trench STT, and the trench STT is formed in a process differing from the step of forming the slit SLI. For this reason, the y-direction position in the first portion SLTo formed in the slit SLI and the y-direction position in the second portion SLTt formed in the trench STT may deviate from each other. In other words, FIG. 4 shows an example in which the center position of the first portion SLTo in the y direction corresponds to the center position of the second portion SLTt in the y direction; however, the first embodiment is not limited to this example. As shown in FIG. 32, the center position of the first portion SLTo in the y direction may deviate from the center position of the second portion SLTt in the y direction. FIG. 32 shows a cross-sectional structure of a part of a memory cell array in a memory device according to a first modification of the first embodiment, and shows the same area as that shown in FIG. 4. The deviation may stem from a misalignment of a photolithography mask for forming a trench STT, which is used in the process described above with reference to FIGS. 20, 21, and 22.

Figure 33:
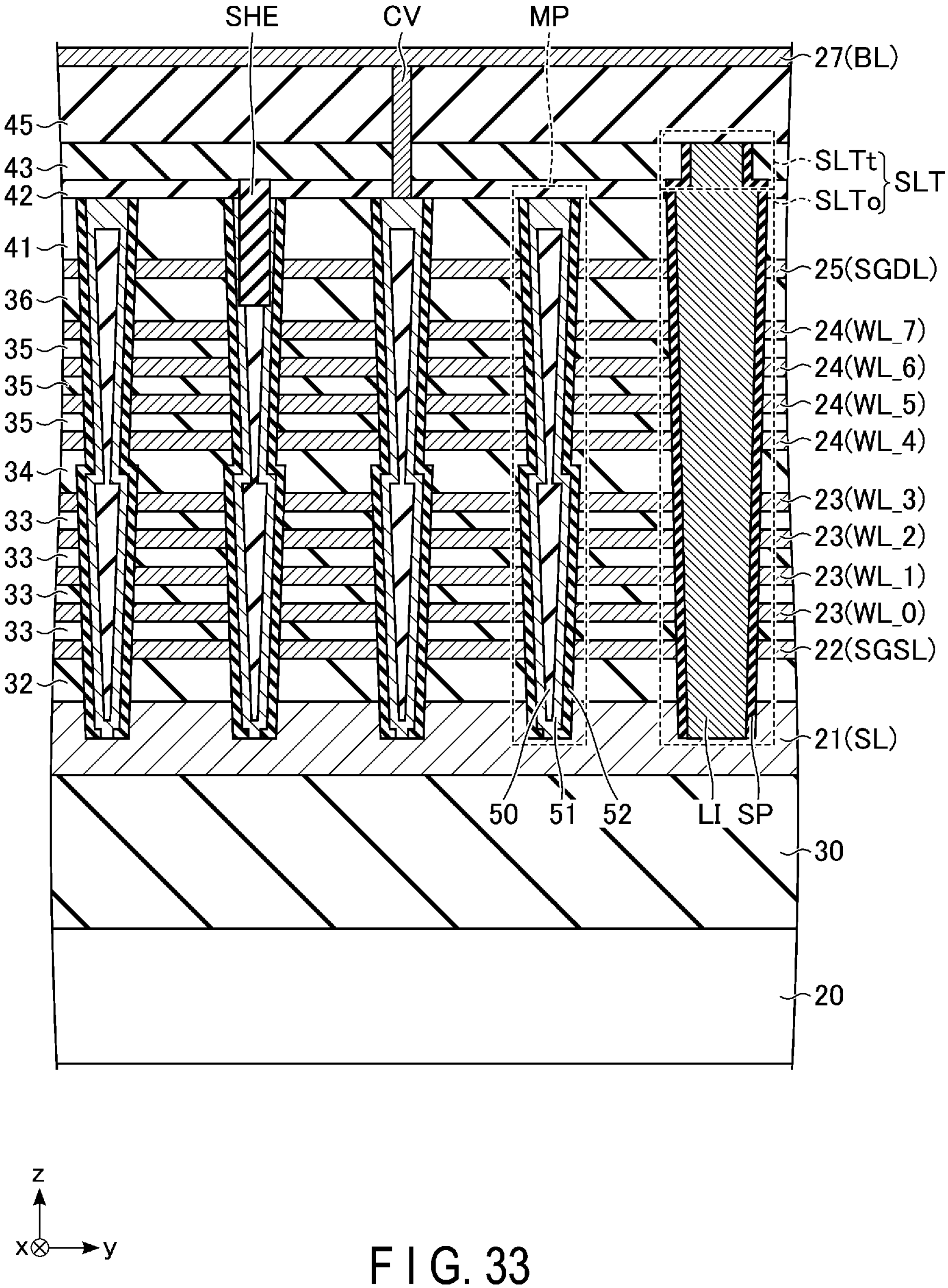
FIGS. 33 to 34 show examples of cross-sectional structures of a part of a memory cell array in a memory device according to a second modification of the first embodiment.
Figure 34:
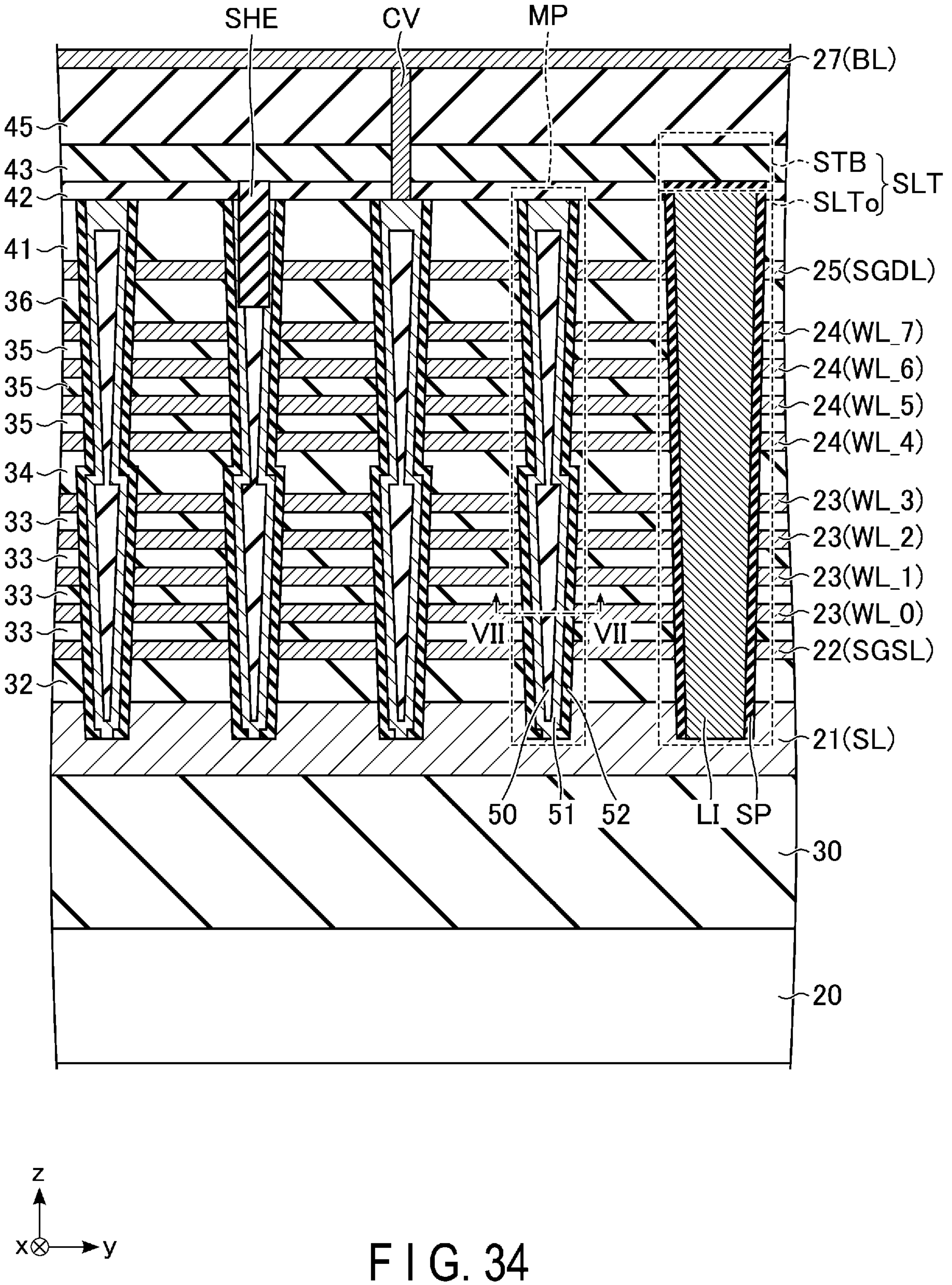

The shape of the above-described memory pillar MP is merely an example and the embodiment is not limited to this example. For example, as shown in FIGS. 33 and 34, the upper surface of the memory pillars MP is flush with, for example, the upper surface of the insulator 41. FIG. 33 shows a cross-sectional structure of a part of a memory cell array in a memory device according to a second modification of the first embodiment, and shows the same area as that shown in FIG. 4. FIG. 34 shows a cross-sectional structure of a part of the memory cell array in the memory device according to the second modification of the first embodiment, and shows the same area as that shown in FIG. 5. The upper surface of the first portion SLTc of the member SLT is flush with, for example, the upper surface of the insulator 42. The bridge STB consists of a part of the insulator 43.

The structure of the memory device 1 of the second modification can be formed by the following process, for example. In this process, memory holes UMH are formed in a manner similar to the process described above with reference to FIG. 18 after the process shown in FIGS. 10 and 11, without forming a slit SLI and an insulator SM7, and memory holes LMH are subsequently formed. However, an insulator 42 has not yet been formed at this time. Similarly to the process described above with reference to FIG. 19, memory pillars MP are formed. An insulator 42 is formed on the upper surface of the insulator 41 and the upper surfaces of the memory pillars MP. Similarly to the process described above with reference to FIGS. 12 and 13, a slit SLI is formed. This slit SLI also penetrates the insulator 42. Similarly to the process described above with reference to FIGS. 14 and 15, an insulator SM7 is formed. Similarly to the process described above with reference to FIGS. 20, 21, and 22, an insulator 43, trenches STT, and bridges STB are formed. These trenches STT are, however, formed in the insulator 43. In this process, bridges STB consisting of a portion of the insulator 43 above the insulator SM7 and in which trenches STT are not formed are formed. The process thereafter is the same as the process shown in FIG. 23 and thereafter. Specifically, the insulator SM7 is removed, and the insulators SM1, SM2, SM4, and SM5 are replaced with the conductors 22, 23, 24, and 25 respectively, and an insulator SP and a conductor LI are formed in the slit SLI and the trench STT.

Figure 35:
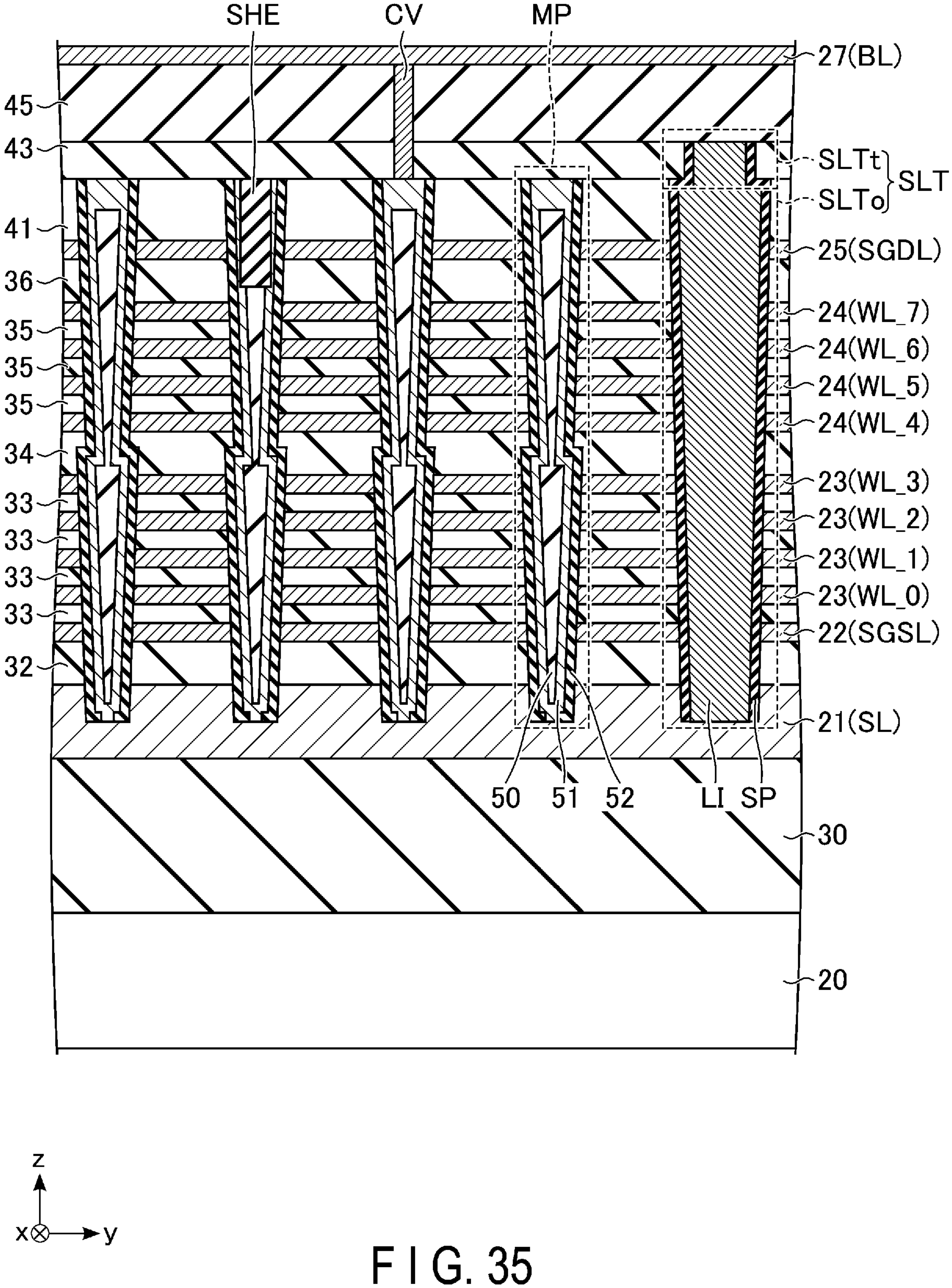
FIGS. 35 to 36 show examples of cross-sectional structures of a part of a memory cell array in a memory device according to a third modification of the first embodiment.
Figure 36:
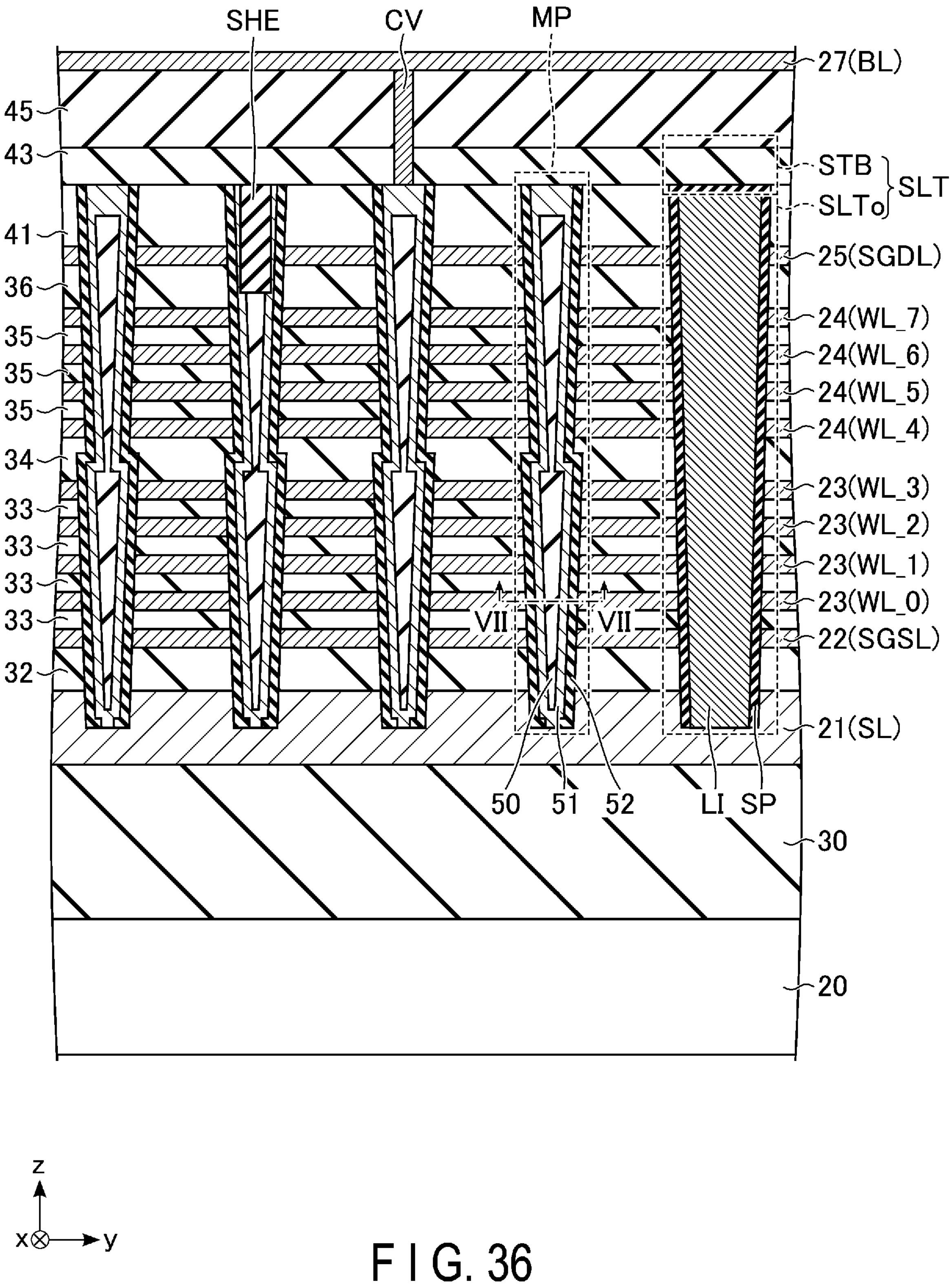

As shown in FIGS. 35 and 36, the insulator 42 of the second modification is not necessarily provided. FIG. 35 shows a cross-sectional structure of a part of a memory cell array in a memory device according to a third modification of the first embodiment, and shows the same area as that shown in FIG. 4. FIG. 36 shows a cross-sectional structure of a part of the memory cell array in the memory device according to the third modification of the first embodiment, and shows the same area as that shown in FIG. 5. As shown in FIGS. 35 and 36, the insulator 43 is positioned on the upper surface of the insulator 41. The upper surface of the first portion SLTo of the member SLT is flush with the upper surface of the insulator 41 and the upper surfaces of the memory pillars MP.

In the above, the example in which the memory pillar MP consists of two portions formed in memory holes LMH and UMH, which are formed in separate processes, namely a lower memory pillar LMP and an upper memory pillar UMP, is described. The memory pillar MP does not necessarily consist of two portions. In this case, the memory pillar MP includes a structure similar to a portion that includes the upper surface of the upper memory pillar UMP in which a semiconductor 51 is formed in a portion from which the upper portion of the core 50 is removed, and a structure similar to a portion that includes the lower surface of the lower memory pillar LMP to which the bottom surface or the side surface of the layer stack 52 is open within the conductor 21. In this case, for example, a slit SLI and an insulator SM7 are formed before a memory hole is formed for forming a memory pillar MP.

Furthermore, the memory pillar MP may consist of three or more portions. In this case, for example, similarly to the process shown in FIG. 9, the process of forming a memory hole for the portion other than the uppermost portion of the memory pillar MP and forming an insulator SM3 in the memory hole is repeated. Thereafter, a slit SLI is formed and an insulator SM7 is formed therein similarly to the process shown in FIGS. 12 and 13, and a memory hole (corresponding to the memory hole UMH) of the upper most portion of the memory pillar MP is formed similarly to the process of FIG. 18. The process thereafter is the same as the process shown in FIG. 19 and thereafter.

Figure 37:
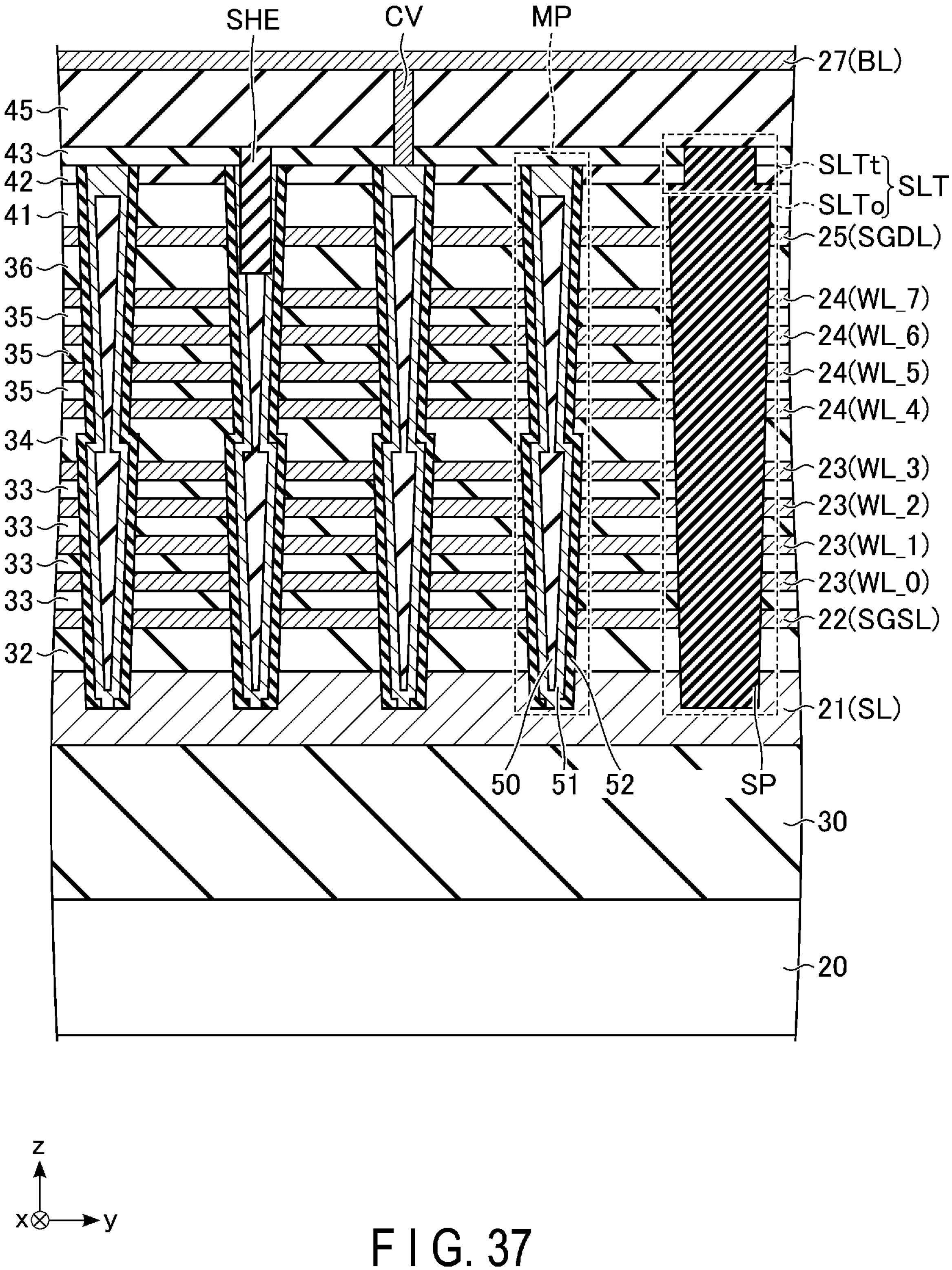
FIGS. 37 to 38 show examples of cross-sectional structures of a part of a memory cell array in a memory device according to a fourth modification of the first embodiment.

As shown in FIG. 37, the member SLT may include a thick insulator SP without including a conductor LI, or may be filled with an insulator SP. FIG. 37 shows a cross-sectional structure of a part of a memory cell array in a memory device according to a fourth modification of the first embodiment, and shows the same area as that shown in FIG. 4. As shown in FIG. 37, the insulator SP is positioned in the area that includes the center of the member SLT in the y direction, and fills, for example, the area of the member SLT (or, the slit SLI and the trench STT).

Figure 38:
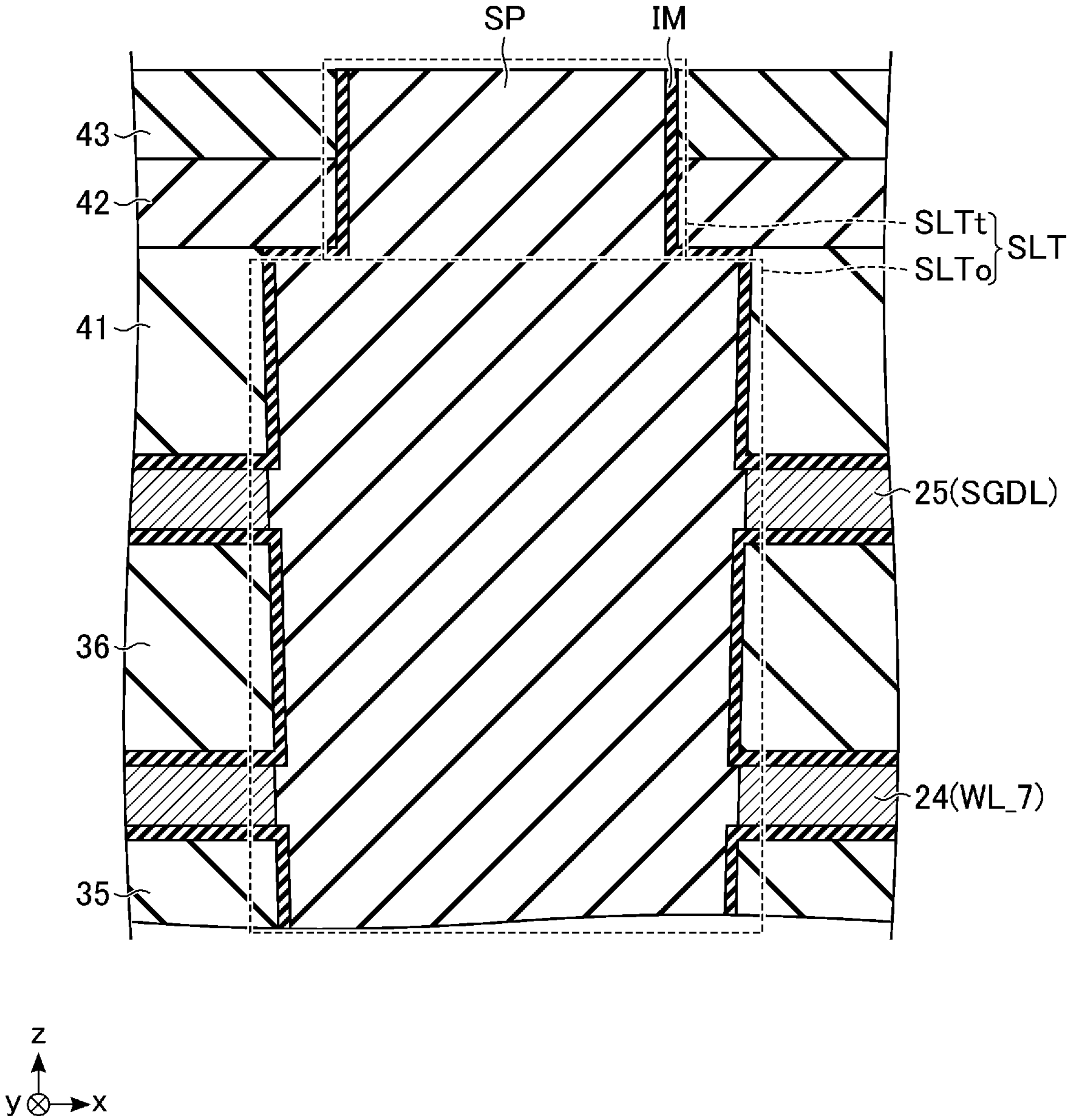

FIG. 38 shows a structure in which, as described in the above with reference to FIG. 4, a different material is provided on the surfaces of the conductors 22, 23, 24 and/or 25 in the fourth modification. FIG. 38 shows a cross-sectional structure of a part of the memory cell array in the memory device according to the fourth modification of the first embodiment, and shows an enlarged upper end portion of the member SLT. As illustrated in FIG. 38, an insulator IM is provided on the upper surface and the lower surface of each of the conductors 24 and 25. The insulator IM is also positioned on the upper surface and the lower surface of each of the conductors 22 and 23. The insulator IM contains a material differing from that of the insulators 32 to 36, 41 to 43, and SP, for example aluminum oxide. The insulator IM is formed by, for example, deposition after the insulators SM1, SM2, SM4, and SM5 are removed, as described in the above with reference to FIG. 26.

The insulator IM may also be positioned between the insulator SP and an insulator in the vicinity. In other words, the insulator IM may be positioned between the insulator SP and the insulator 43, between the insulator SP and the insulator 42, between the insulator SP and the insulator 41, between the insulator SP and the insulator 36, and/or between the insulator SP and the insulator 35. Furthermore, the insulator IM may be positioned between the insulator SP and the insulator 34, between the insulator SP and the insulator 33, and/or between the insulator SP and the insulator 32, similarly to the insulators 41, 36, and 35.

Each modification can be combined with another modification unless explicitly mentioned otherwise or obviously excluded, and the description of the foregoing modifications is applicable as a description of another modification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a plurality of first conductors aligned in a first direction separately from each other;

a memory pillar that penetrates the plurality of first conductors in the first direction and includes a semiconductor and a film that surrounds the semiconductor; and a first member that penetrates the plurality of first conductors in the first direction and has a first portion and a plurality of second portions, the first portion extending in a second direction intersecting with the first direction, the plurality of second portions being aligned spaced apart in the second direction on an upper surface of the first portion, a length of each of the plurality of second portions in a third direction intersecting with the first direction and the second direction being shorter than a length of the first portion in the third direction, wherein the first member further includes a bridge that is positioned on the upper surface of the first portion and between two neighboring ones of the plurality of second portions and extends on the upper surface of the first portion across both ends of the first portion.

2. The memory device according to claim 1, wherein the first member comprises a plurality of the bridges, and the plurality of the bridges and the plurality of second portions are aligned to alternate with each other one at a time in the second direction.

3. The memory device according to claim 1, wherein the first portion spans continuously in the first direction and the second direction.

4. The memory device according to claim 1, further comprising a first insulator on an upper surface of the memory pillar, wherein the bridge includes a part of the first insulator, and the first insulator on the upper surface of the memory pillar is continuous with the part of the first insulator included in the bridge.

5. The memory device according to claim 1, wherein a center position of the plurality of second portions in the third direction differs from a center position of the first portion in the third direction.

6. The memory device according to claim 1, wherein the first member includes a second conductor and a second insulator on a surface of the second conductor.

7. The memory device according to claim 6, wherein the second insulator covers a side surface of the second conductor.

8. The memory device according to claim 6, wherein the second insulator has a portion positioned on a lower surface of the bridge and a side surface of the bridge.

9. The memory device according to claim 6, further comprising a first insulator that is positioned on an upper surface of the memory pillar and is included in the bridge, wherein the second conductor faces the first insulator in the second portion, with the second insulator interposed therebetween.

10. The memory device according to claim 6, wherein the second insulator is positioned continuously over a side surface of the first portion and side surfaces of the plurality of second portions.

11. The memory device according to claim 4, wherein the first member includes a second insulator and a third insulator on a surface of the second insulator, the third insulator contains a material differing from a material of the second insulator, and the second insulator faces the first insulator in the second portion, with the third insulator interposed therebetween.

12. The memory device according to claim 11, wherein the second insulator has a portion positioned in a center of the first member in the third direction.

13. A memory device comprising:

a plurality of first conductors aligned in a first direction separately from each other;

a memory pillar that penetrates the plurality of first conductors in the first direction and includes a semiconductor and a film that surrounds the semiconductor; and a first member that penetrates the plurality of first conductors in the first direction and has a first portion and a plurality of second portions, the first portion extending in a second direction intersecting with the first direction, the plurality of second portions being aligned spaced apart in the second direction on an upper surface of the first portion, a length of each of the plurality of second portions in a third direction intersecting with the first direction and the second direction being shorter than a length of the first portion in the third direction, and the first portion and the second portions being continuous.

14. The memory device according to claim 13, wherein the first portion spans continuously in the first direction and the second direction.

15. The memory device according to claim 13, wherein a center position of the plurality of second portions in the third direction differs from a center position of the first portion in the third direction.

16. The memory device according to claim 13, wherein the first member includes a second conductor and a second insulator on a surface of the second conductor.

17. The memory device according to claim 16, wherein the second insulator covers a side surface of the second conductor.

18. The memory device according to claim 16, wherein the second insulator is positioned continuously over a side surface of the first portion and side surfaces of the plurality of second portions.

19. The memory device according to claim 18, wherein the second insulator has a portion positioned on an upper surface of the first portion.

20. The memory device according to claim 13, wherein the first member includes a second insulator having a portion positioned in a center of the first member in the third direction.

* * * * *